United States Patent
Ramachandran Nair

(10) Patent No.: US 11,450,397 B2
(45) Date of Patent: Sep. 20, 2022

(54) MEMORY SYSTEM

(71) Applicant: Kioxia Corporation, Tokyo (JP)

(72) Inventor: Prashob Ramachandran Nair, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/173,446

(22) Filed: Feb. 11, 2021

(65) Prior Publication Data
US 2021/0280264 A1   Sep. 9, 2021

(30) Foreign Application Priority Data
Mar. 3, 2020   (JP) .............................. JP2020-035802

(51) Int. Cl.
| | | |
|---|---|---|
| G11C 29/24 | (2006.01) | |
| G11C 29/12 | (2006.01) | |
| G11C 29/38 | (2006.01) | |
| G11C 29/36 | (2006.01) | |

(52) U.S. Cl.
CPC ........ G11C 29/24 (2013.01); G11C 29/12015 (2013.01); G11C 29/36 (2013.01); G11C 29/38 (2013.01)

(58) Field of Classification Search
CPC ... G11C 29/24; G11C 29/12015; G11C 29/36; G11C 29/38; G11C 11/5642
See application file for complete search history.

(56) References Cited

U.S. PATENT DOCUMENTS

| | | |
|---|---|---|
| 10,095,568 B2 | 10/2018 | Khoueir et al. |
| 10,529,730 B2 | 1/2020 | Amaki et al. |
| 2016/0225461 A1* | 8/2016 | Tuers ..................... G11C 16/26 |
| 2018/0307411 A1 | 10/2018 | Kim et al. |
| 2019/0074283 A1* | 3/2019 | Amaki ................ H01L 27/1157 |
| 2019/0122705 A1 | 4/2019 | Muchherla et al. |
| 2019/0278517 A1 | 9/2019 | Watanabe et al. |

FOREIGN PATENT DOCUMENTS

JP   2019-046530 A   3/2019

* cited by examiner

*Primary Examiner* — Mohammed A Bashar
(74) *Attorney, Agent, or Firm* — Foley & Lardner LLP

(57) ABSTRACT

A memory system includes a nonvolatile semiconductor memory and a memory controller. The memory controller is configured to schedule plural types of reliability countermeasure processes to be executed for the nonvolatile semiconductor memory. The plural types of reliability countermeasure processes includes at least a first reliability countermeasure process. The memory controller is configured to skip the first reliability countermeasure process to be executed when the first reliability countermeasure process is not necessary to be executed by executing an access process other than the first reliability countermeasure process to the nonvolatile semiconductor memory.

16 Claims, 17 Drawing Sheets

FIG. 6

| EVENT | COUNTERMEASURES |
|---|---|
| DATA RETENTION | PATROL READ AND ECC CORRECTION AT PREDETERMINED TIME INTERVALS |
| FIRST READ | DUMMY READ AT PREDETERMINED TIME INTERVALS |
| READ DISTURB | SCAN READ AND REFRESH (IF NECESSARY) |
| CONCENTRATION OF P/E CYCLE | WEAR LEVELING |
| TEMPERATURE CHANGE DURING READ/WRITE | PROCESS BY CONSIDERING VOLTAGE SHIFT |

FIG. 10

| | COUNTERMEASURES | Page_1 | Page_2 | Page_(n-1) | Page_n |
|---|---|---|---|---|---|
| 111 | PATROL READ FOR DATA RETENTION COUNTERMEASURE (TIME STAMP TS_PR) | $TS\_PR_1$ | $TS\_PR_2$ | $TS\_PR_{(n-1)}$ | $TS\_PR_n$ |
| 111 | SCAN READ FOR READ DISTURB COUNTERMEASURE (TIME STAMP TS_SR) | $TS\_SR_1$ | $TS\_SR_2$ | $TS\_SR_{(n-1)}$ | $TS\_SR_n$ |
| 112 | PATROL READ FOR DATA RETENTION COUNTERMEASURE (BITMAP BM_PR) | 1 | 0 | 1 | 1 |
| 112 | SCAN READ FOR READ DISTURB COUNTERMEASURE (BITMAP BM_SR) | 1 | 0 | 1 | 0 |

FIG. 11

| | COUNTERMEASURES | Block_1 | Block_2 | Block_(m-1) | Block_m |
|---|---|---|---|---|---|
| 111 | DUMMY READ FOR FIRST READ COUNTERMEASURE (TIME STAMP TS_DR) | $TS\_DR_1$ | $TS\_DR_2$ | $TS\_DR_{(m-1)}$ | $TS\_DR_m$ |
| 112 | DUMMY READ FOR FIRST READ COUNTERMEASURE (BITMAP BM_DR) | 1 | 0 | 1 | 1 |

FIG. 12

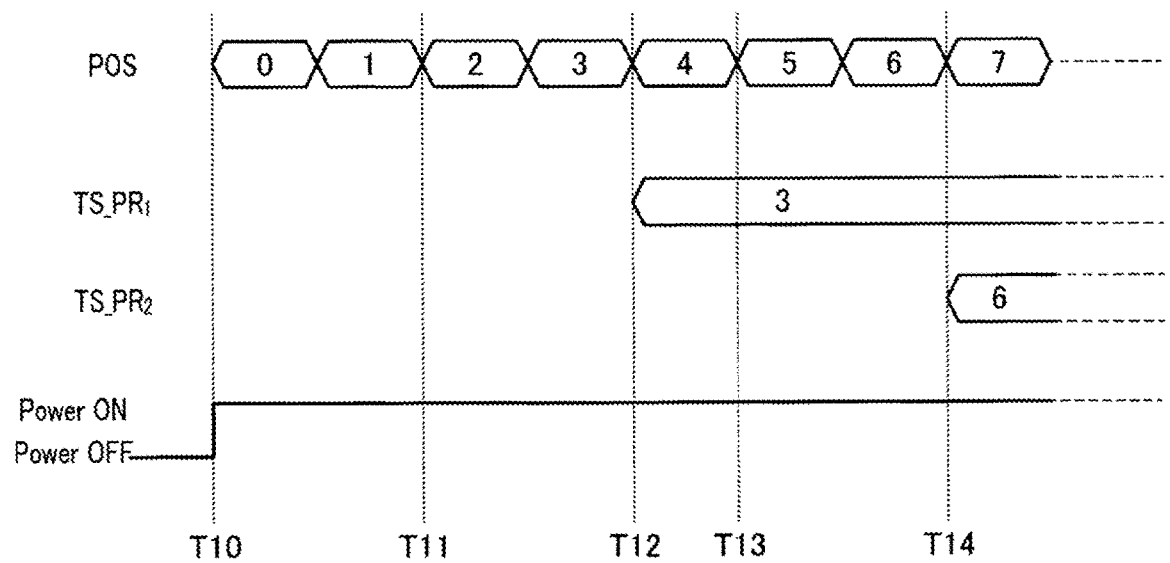

FIG. 19

| Read Type | TS_PR | TS_SR | TS_DR |
|---|---|---|---|
| HOST READ (HR) | SETTING TO CURRENT POS | SETTING TO CURRENT POS | SETTING TO CURRENT POS |
| INTERNAL READ | SETTING TO CURRENT POS | SETTING TO CURRENT POS | SETTING TO CURRENT POS |
| PATROL READ (PR) | SETTING TO CURRENT POS | SETTING TO CURRENT POS | SETTING TO CURRENT POS |
| SCAN READ (SR) | SETTING TO CURRENT POS | SETTING TO CURRENT POS | SETTING TO CURRENT POS |
| DUMMY READ (DR) | NO UPDATE | NO UPDATE | SETTING TO CURRENT POS |

FIG. 20

| Event Type | BM_PR | BM_SR | BM_DR |
|---|---|---|---|
| HOST WRITE | SET | RESET | SET |
| INTERNAL WRITE | SET | RESET | SET |
| ERASE | RESET | RESET | RESET |
| RD COUNTER EXCEEDS THRESHOLD VALUE | As Is | SET | As Is |
| DEFECTIVE BLOCK | RESET | RESET | RESET |
| CERTAIN READ EQUIVALENT TO COUNTERMEASURE | As Is | RESET | As Is |

MEMORY SYSTEM

CROSS-REFERENCE TO RELATED APPLICATION

This application is based upon and claims the benefit of priority from Japanese Patent Application No. 2020-035802, filed Mar. 3, 2020, the entire contents of which are incorporated herein by reference.

FIELD

Embodiments described herein relate generally to a memory system.

BACKGROUND

A NAND flash memory in which memory cells are three-dimensionally stacked is known. Countermeasures are taken to ensure the reliability of such a NAND flash memory.

DESCRIPTION OF THE DRAWINGS

FIG. 6 is a schematic diagram illustrating an example of reliability countermeasures applied to the memory system according to at least one embodiment.

FIG. 10 is a schematic diagram illustrating an example of a table in which a time stamp and a bitmap used in page-based scheduling of the reliability countermeasures are stored, in at least one embodiment.

FIG. 11 is a schematic diagram illustrating an example of a table in which a bitmap used in block-based scheduling of the reliability countermeasures is stored, in at least one embodiment.

FIG. 12 is a schematic diagram illustrating an example of setting the time stamp in at least one embodiment.

FIG. 19 is a schematic diagram illustrating another example of setting the time stamp in at least one embodiment.

FIG. 20 is a schematic diagram illustrating an example of setting the bitmap in at least one embodiment.

DETAILED DESCRIPTION

Figure 1:
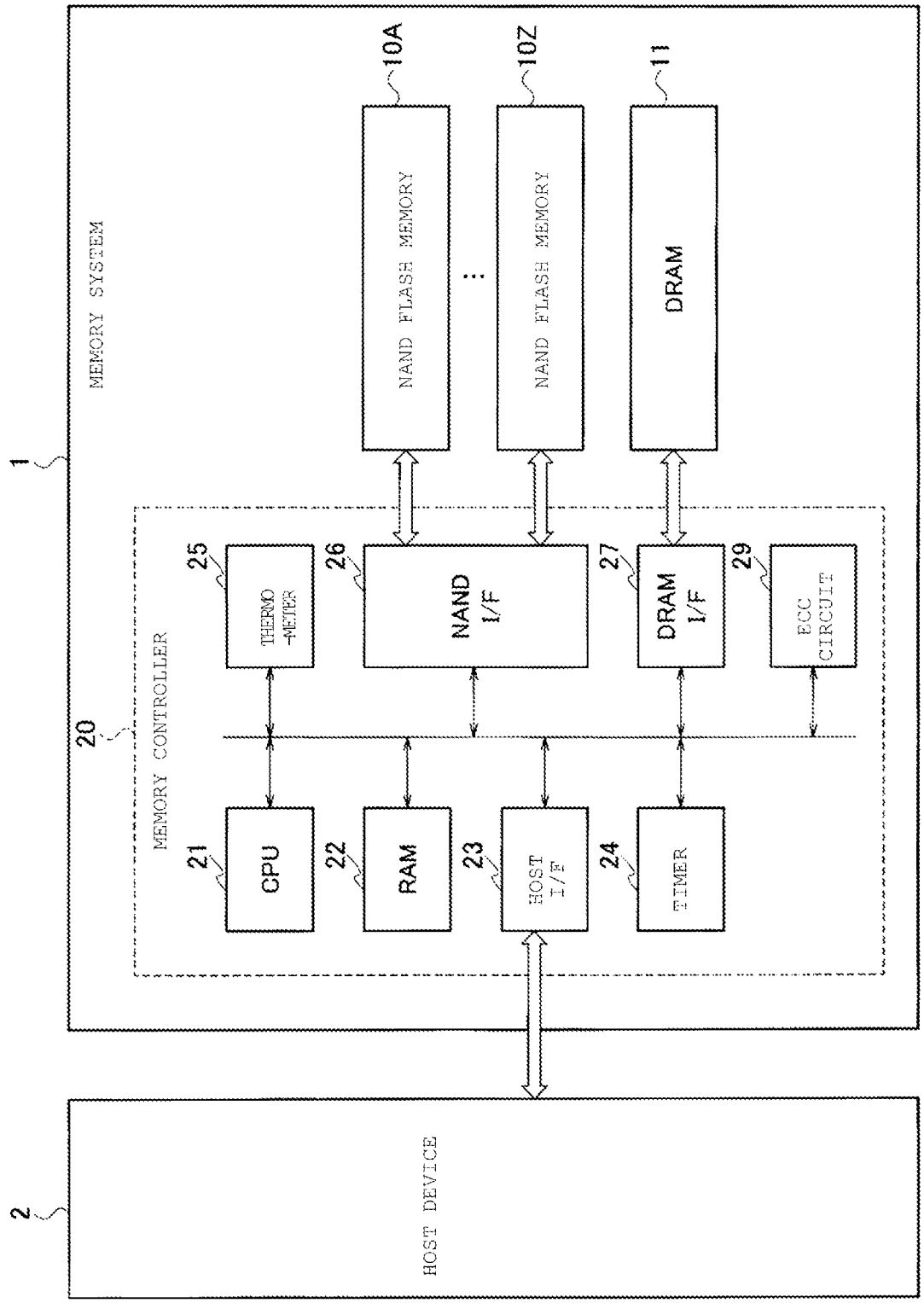
FIG. 1 is a schematic block diagram illustrating a configuration example of a memory system according to at least one embodiment.

At least one embodiment provides a memory system in which it is possible to optimize a schedule of reliability countermeasures of a nonvolatile semiconductor memory, to reduce an influence of deterioration or quality variation of the nonvolatile semiconductor memory, and to improve the performance and reliability.

In general, according to at least one embodiment, a memory system includes a nonvolatile semiconductor memory and a memory controller. The memory controller is configured to schedule plural types of reliability countermeasure processes to be executed for the nonvolatile semiconductor memory. The plural types of reliability countermeasure processes includes at least a first reliability countermeasure process. The memory controller is configured to skip the first reliability countermeasure process to be executed when the first reliability countermeasure process is not necessary to be executed by executing an access process other than the first reliability countermeasure process to the nonvolatile semiconductor memory.

Hereinafter, at least one embodiment will be described with reference to the drawings. In the following description with reference to the drawings, the same or similar components are denoted by the same or similar reference signs. Furthermore, it needs to be noted that the drawings are schematic, and the relation between the thickness and the planar dimensions and the like of each component is different from the actual one. Therefore, specific thickness and dimensions are to be determined in consideration of the following description. In the drawings, components having different dimensional relationships and scales may be provided.

At least one embodiment described below exemplifies a device and a method for embodying the technical idea, but does not specify the material, the shape, the structure, the arrangement, and the like of each component. Various changes may be made to the embodiments within the scope of the claims.

Embodiment

<Configuration of Memory System>

FIG. 1 is a block diagram illustrating a configuration example of a memory system 1 according to at least one embodiment. The memory system 1 according to at least one embodiment is configured as, for example, a solid state drive (SSD). As illustrated in FIG. 1, the memory system 1 includes a nonvolatile semiconductor memory such as NAND flash memories 10A to 10Z, a dynamic random access memory (DRAM) 11, and a memory controller 20. The NAND flash memories 10A to 10Z are connected to the memory controller 20 via a plurality of channels. The nonvolatile memory is not limited to the NAND flash memories 10A to 10Z, and any of a NOR flash memory, a resistive random access memory (ReRAM), a phase-change memory (PCM), a ferroelectric random access memory (FeRAM), and the like may be applied as the nonvolatile semiconductor memory. A magneto tunnel junction (MTJ) variable resistance element may be also applied. In the following description, the NAND flash memories 10A to 10Z will be mainly described as the nonvolatile memory. The NAND flash memories 10A to 10Z are also collectively referred to as a NAND flash memory 10.

The NAND flash memories 10A to 10Z are nonvolatile semiconductor memories capable of storing data in a nonvolatile manner. Each of the NAND flash memories 10A to 10Z may operate independently. The number of NAND flash memories 10 in the memory system 1 is not particularly limited, and the number may be designed to any number.

The DRAM 11 is a volatile memory capable of temporarily storing data. The number of volatile memories in the memory system 1 is not particularly limited, and the number may be designed to any number. The volatile memory in the memory system 1 is not limited to the DRAM. For example, the memory system 1 may include a static random access memory (SRAM) as the volatile memory.

The memory controller 20 is an IC such as an SoC, an FPGA, or an ASIC, and can instruct the NAND flash memory 10 and the DRAM 11 to perform various operations. The memory controller 20 may execute an operation based on a request from an external host device 2 and an operation that does not directly depend on the request from the host device 2.

As illustrated in FIG. 1, the memory controller 20 includes a central processing unit (CPU) 21, a built-in memory (e.g., RAM: Random Access Memory) 22, a host interface circuit 23, a timer 24, a thermometer 25, and a NAND interface circuit 26, a DRAM interface circuit 27, and an error checking and correcting (ECC) circuit 29.

The CPU 21 may control the operation of the entire memory controller 20 by executing firmware. For example, the CPU 21 issues a read command in response to a read request received from the host device 2, and transmits the issued command to the NAND interface circuit 26. The CPU 21 may execute a reliability countermeasure process for the NAND flash memory. The details of an operation of the reliability countermeasure process will be described later.

The built-in memory 22 is used as a work area of the CPU 21. In the built-in memory 22, for example, parameters for managing the NAND flash memory 10 and various management tables are loaded. For example, the built-in memory 22 stores a queue of instructions (command queue 28) to be issued to the NAND flash memory 10. The built-in memory 22 stores an address conversion table (LUT: Look Up Table) for converting a logical address associated with data stored in a block BLK of the NAND flash memory 10 into a physical block address (PBA) of the block BLK. For example, the address conversion table is stored in the NAND flash memory 10, is read when the memory system 1 is started up, and is loaded into the built-in memory 22. As the built-in memory 22, for example, a volatile memory such as a static random access memory (SRAM) may be used.

The host interface circuit 23 can be connected to the host device 2 and controls a communication between the memory system 1 and the host device 2. For example, the host interface circuit 23 controls transfer of data, commands, and addresses between the memory system 1 and the host device 2. The host interface circuit 23 supports communication interface standards such as serial advanced technology attachment (SATA), serial attached SCSI (SAS), and PCI Express (PCIe) (registered trademark). That is, examples of the host device 2 connectable to the memory system 1 include a computer including interfaces of SATA, SAS, or PCIe.

The timer 24 may measure time related to various operations of the memory system 1. For example, the timer 24 measures seconds elapsed after the power of the memory system 1 is turned on. In the following description, the seconds elapsed after the power is turned on is referred to as power-on-second (POS).

The thermometer 25 may measure temperature of the memory system 1. Specifically, the thermometer 25 may measure the temperature at a place at which the thermometer 25 is provided, to indirectly measure the temperature of the entirety of the memory controller 20 or the temperature of the NAND flash memory 10. The measured temperature is referred to by the CPU 21 during the operation of the reliability countermeasure process, for example.

The NAND interface circuit 26 is connected to the NAND flash memories 10A to 10Z and controls communication between the memory controller 20 and the NAND flash memory 10. The NAND interface circuit 26 is configured based on a NAND interface standard.

The DRAM interface circuit 27 is connected to the DRAM 11 and controls communication between the memory controller 20 and the DRAM 11. The DRAM interface circuit 27 is configured based on a DRAM interface standard. The configuration of the DRAM interface circuit 27 is not limited to the above description, and may be changed based on the type of volatile memory in the memory system 1.

The ECC circuit 29 performs ECC correction on data read from the NAND flash memory 10. More specifically, when data is written to the NAND flash memory 10, the ECC circuit 29 generates an error correction code for each piece of data having any length, based on the data received from the host device 2. When data is read from the NAND flash memory 10, the ECC circuit 29 decodes the data based on the error correction code and detects whether the data includes an error. When an error is detected, the ECC circuit 29 specifies the bit position of the detected error and corrects the error.

The configuration of the memory controller 20 described above is an example, and the configuration of the memory controller is not limited to the above description. For example, the timer 24 and the thermometer 25 may not be provided in the memory controller 20, and may be externally connected to the memory controller 20. The thermometer 25 may be built in the NAND flash memory 10.

<Configuration of NAND Flash Memory>

Figure 2:
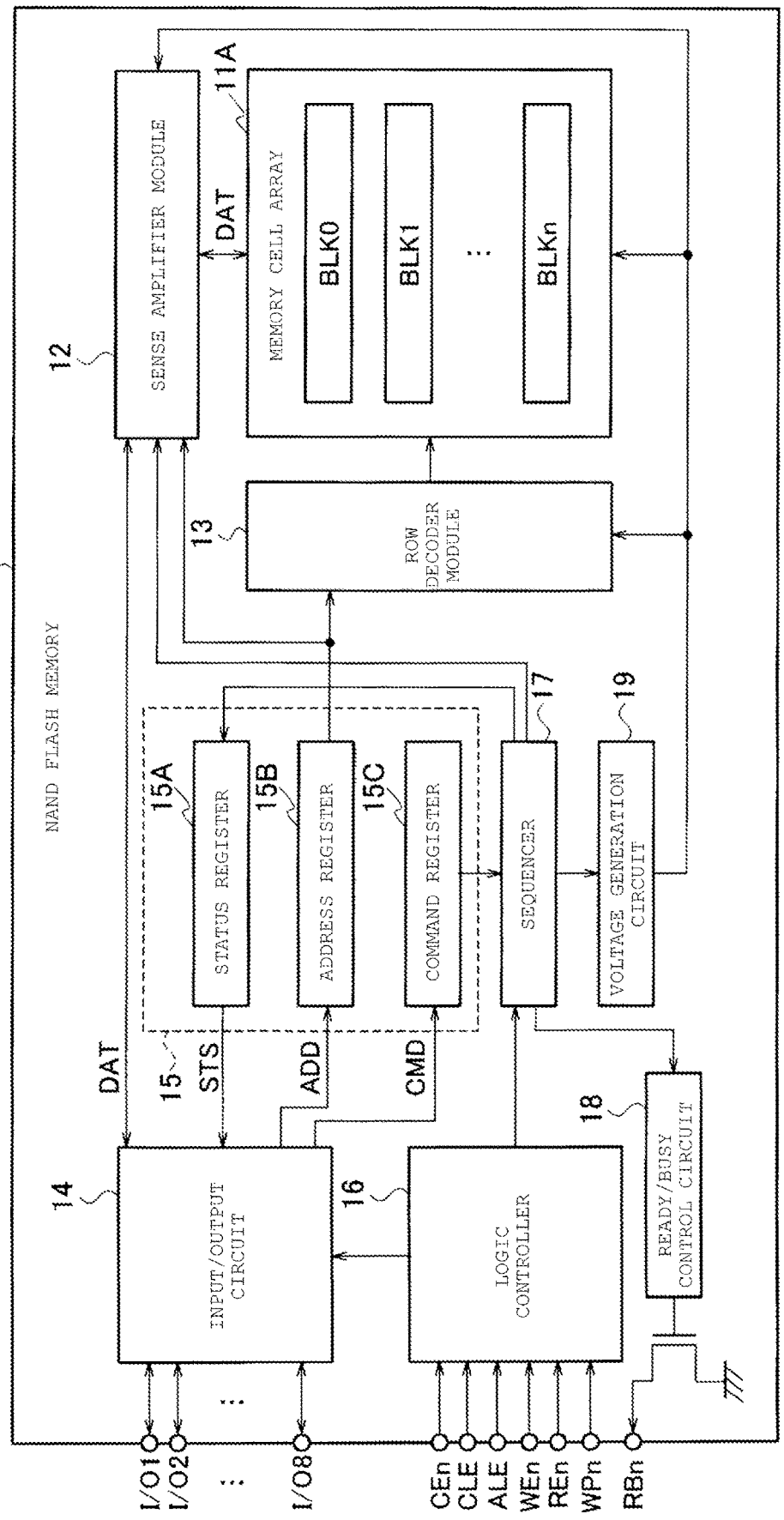
FIG. 2 is a schematic block diagram illustrating a configuration example of a NAND flash memory in at least one embodiment.

FIG. 2 is a schematic block diagram illustrating a configuration example of the NAND flash memory 10 in the embodiment. As illustrated in FIG. 2, the NAND flash memory 10 includes a memory cell array 11A, a sense amplifier module 12, a row decoder module 13, an input/output circuit 14, a register 15, a logic controller 16, a sequencer 17, and a ready/busy control circuit 18, and a voltage generation circuit 19.

The memory cell array 11A includes blocks BLK0 to BLKn (n is an integer of 0 or more). A block BLK is a group including a plurality of nonvolatile memory cells associated with a bit line and a word line. The block is a unit of a data erase operation, for example. The NAND flash memory 10 may store data of two or more bits in each memory cell by applying, for example, a multi-level cell (MLC) method. The NAND flash memory 10 may store data of three or more bits in each memory cell by applying a triple-level cell (TLC) method or a quad-level cell (QLC) method to the NAND flash memory 10.

The sense amplifier module 12 may output data DAT read from the memory cell array 11A to the memory controller 20 via the input/output circuit 14. The sense amplifier module 12 may transfer write data DAT received from the memory controller 20 via the input/output circuit 14, to the memory cell array 11A.

The row decoder module 13 may select a block BLK as a target for various operations based on a block address stored in an address register 15B. The row decoder module 13 may transfer voltage supplied from the voltage generation circuit 19 to the selected block BLK.

The input/output circuit 14 may transmit and receive, for example, an 8-bit input/output signal I/O (I/O1 to I/O8) to and from the memory controller 20. For example, the input/output circuit 14 transfers write data DAT included in the input/output signal I/O received from the memory controller 20, to the sense amplifier module 12, and transmits read data DAT transferred from the sense amplifier module 12 to the memory controller 20 as the input/output signal I/O.

The register 15 includes a status register 15A, the address register 15B, and a command register 15C. For example, the status register 15A stores status information STS of the sequencer 17, and transfers the status information STS to the input/output circuit 14 based on an instruction of the sequencer 17. The address register 15B stores address information ADD transferred from the input/output circuit 14. For example, a column address and a block address included in the address information ADD are used in the sense amplifier module 12 and the row decoder module 13, respectively. The command register 15C stores a command CMD transferred from the input/output circuit 14.

The logic controller 16 may control the input/output circuit 14 and the sequencer 17 based on various control signals received from the memory controller 20. As the various control signals, for example, a chip enable signal CEn, a command latch enable signal CLE, an address latch enable signal ALE, a write enable signal Wen, a read enable signal REn, and a write protect signal WPn are used. The signal CEn is a signal for enabling the NAND flash memory 10. The signal CLE is a signal for notifying the input/output circuit 14 that the signal input to the NAND flash memory 10 is the command CMD. The signal ALE is a signal for notifying the input/output circuit 14 that the signal input to the NAND flash memory 10 is the address information ADD. The signals WEn is, for example, a signal for instructing an input of the input/output signal I/O to the input/output circuit 14. The signals REn is, for example, a signal for instructing an output of the input/output signal I/O to the input/output circuit 14. The signal WPn is, for example, a signal for bringing the NAND flash memory 10 into a protected state when the power is turned on and off.

The sequencer 17 may control the operation of the entirety of the NAND flash memory 10 based on the command CMD stored in the command register 15C. For example, the sequencer 17 controls the sense amplifier module 12, the row decoder module 13, the voltage generation circuit 19, and the like to execute various operations such as a write operation and a read operation.

The ready/busy control circuit 18 may generate a ready/busy signal RBn based on an operating state of the sequencer 17. The signal RBn is, for example, a signal for notifying the memory controller 20 whether the NAND flash memory 10 is in a ready state for receiving an instruction from the memory controller 20 or a busy state for not receiving the instruction.

The voltage generation circuit 19 may generate a desired voltage based on the control of the sequencer 17, and supply the generated voltage to the memory cell array 11A, the sense amplifier module 12, the row decoder module 13, and the like. For example, the voltage generation circuit 19 applies desired voltages to a selected word line and a non-selected word line based on a page address stored in the address register 15B.

<Configuration of Memory Cell Array>

Figure 3:
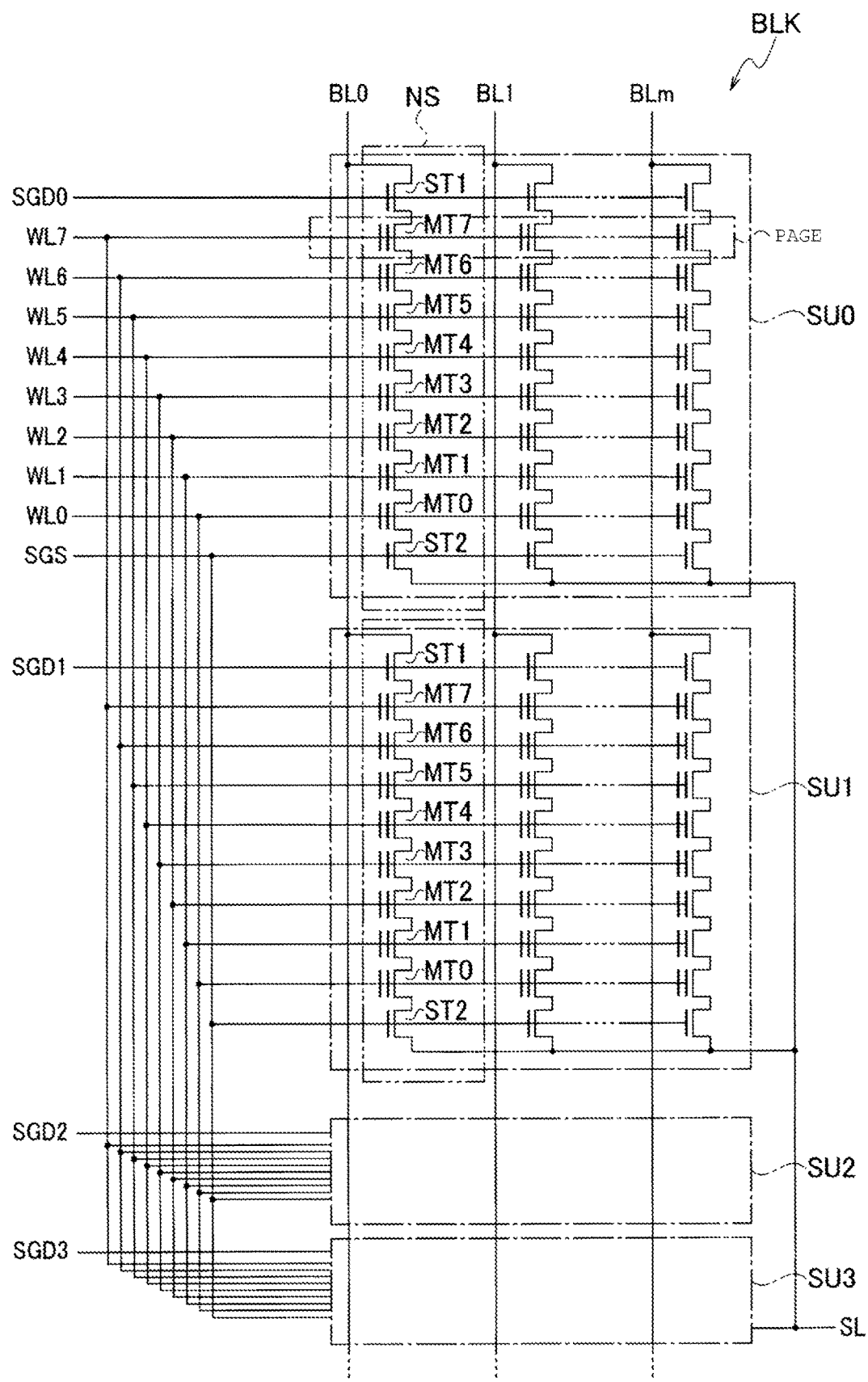
FIG. 3 is a schematic circuit diagram illustrating a configuration example of a memory cell array in the NAND flash memory in at least one embodiment.

FIG. 3 is a circuit diagram illustrating a configuration example of the memory cell array 11A in the NAND flash memory 10 in the embodiment, and illustrates a detailed circuit configuration of one block BLK in the memory cell array 11A. As illustrated in FIG. 3, the block BLK includes four string units SU0 to SU3, for example.

Each of the string units SU may include a plurality of NAND strings NS respectively associated with bit lines BL0 to BLm (m is an integer of 0 or more). Each of the NAND strings NS may include memory cell transistors MT0 to MT7 and select transistors ST1 and ST2, for example.

The memory cell transistor MT may include a control gate and a charge storage layer to store data in a nonvolatile manner. The memory cell transistors MT0 to MT7 in each of the NAND strings NS are connected in series between the source of the select transistor ST1 and the drain of the select transistor ST2. The control gates of the memory cell transistors MT0 to MT7 in the same block BLK are commonly connected to the word lines WL0 to WL7, respectively. In the following description, a set including pieces of 1-bit data stored in a plurality of memory cell transistors MT connected to the common word line WL in each string unit SU is referred to as a "page". Thus, when 2-bit data is stored in one memory cell transistor MT, a set including the plurality of memory cell transistors MT connected to the common word line WL in one string unit SU stores data for two pages.

The select transistors ST1 and ST2 are used to select the string unit SU during various operations. The drain of the select transistor ST1 in the NAND string NS corresponding to the same column address is commonly connected to the corresponding bit line BL. The gates of the select transistors ST1 in the string units SU0 to SU3 are commonly connected to select gate lines SGD0 to SGD3, respectively. In the same block BLK, the source of the select transistor ST2 is commonly connected to a source line SL, and the gate of the select transistor ST2 is commonly connected to a select gate line SGS.

In the circuit configuration of the memory cell array described above, the word lines WL0 to WL7 are provided for each block BLK. The bit lines BL0 to BLm are shared by a plurality of block BLKs. The source line SL is shared by a plurality of blocks BLK. The number of string units SU in each block BLK and the number of memory cell transistors MT and select transistors ST1 and ST2 in each NAND string NS are examples, and any number of string units and any number of memory cell transistors and select transistors may be provided. The number of word lines WL and select gate lines SGD and SGS is changed based on the number of memory cell transistors MT and select transistors ST1 and ST2.

Figure 4:
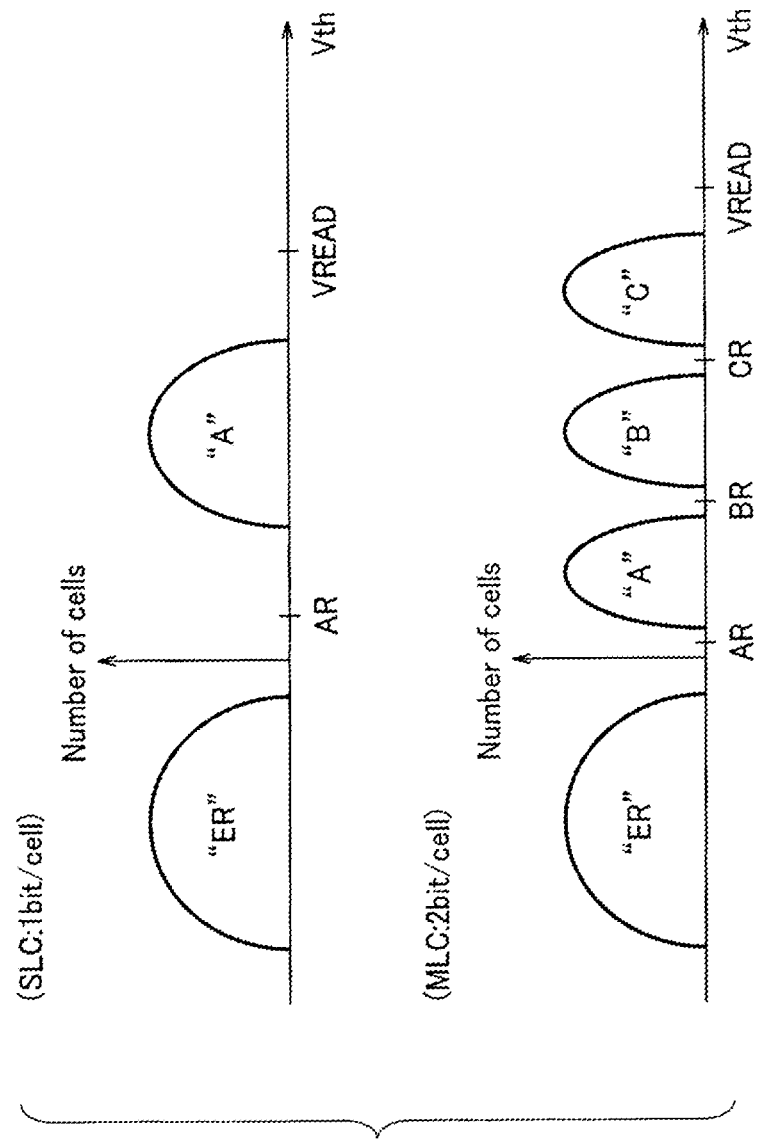
FIG. 4 is a schematic diagram illustrating an example of a threshold voltage distribution and a read voltage of a memory cell transistor in the NAND flash memory in at least one embodiment.

In the circuit configuration of the memory cell array described above, a threshold voltage distribution formed by threshold voltages of the plurality of memory cell transistors MT connected to the common word line WL in one string unit SU is as illustrated in FIG. 4, for example. FIG. 4 illustrates the threshold voltage distribution and a read voltage of the memory cell transistors MT when one memory cell transistor MT stores 1-bit data or 2-bit data. A vertical axis corresponds to the number of memory cell transistors MT. A horizontal axis corresponds to the threshold voltage Vth and the read voltage of the memory cell transistors MT. As illustrated in FIG. 4, the plurality of memory cell transistors MT form a plurality of threshold voltage distributions based on the number of bits of stored data. As an example of a writing method, a single-level cell (SLC) method of storing 1-bit data in one memory cell transistor MT and a multi-level cell (MLC) method of storing 2-bit data in one memory cell transistor MT will be described below.

In a case of the SLC method, the plurality of memory cell transistors MT form two threshold voltage distributions. The two threshold voltage distributions are referred to as an "ER" state and an "A" state in order from the one having the lowest threshold voltage. In the SLC method, for example, data of "1" and data of "0" are assigned to the "ER" state and the "A" state, respectively.

In a case of the MLC method, the plurality of memory cell transistors MT form four threshold voltage distributions. The four threshold voltage distributions are referred to as an "ER" state, an "A" state, a "B" state, and a "C" state in order from the one having the lowest threshold voltage. In the MLC method, for example, data of "11 (lower/upper)", data of "01", data of "00", and data of "01" are assigned to the "ER" state, the "A" state, the "B" state, and the "C" state, respectively.

The read voltage is set between the adjacent threshold voltage distributions described above. For example, a read voltage AR is set between the maximum threshold voltage in the "ER" state and the minimum threshold voltage in the "A" state. Thus, the read voltage AR is used in an operation of determining whether the threshold voltage of the memory cell transistor MT is included in the threshold voltage distribution of the "ER" state or in the threshold voltage distribution of the "A" state. When the read voltage AR is applied to the memory cell transistor MT, the memory cell transistor MT corresponding to the "ER" state enters an ON state, and the memory cell transistor MT corresponding to the "A" state, the "B" state, or the "C" state enters an OFF state. Other read voltages are set in the similar manner. That is, a read voltage BR is set between the threshold voltage distribution of the "A" state and the threshold voltage distribution of the "B" state. A read voltage CR is set between the threshold voltage distribution of the "B" state and the threshold voltage distribution of the "C" state. When the read voltage BR is applied to the memory cell transistor MT, the memory cell transistor MT corresponding to the "ER" state or the "A" state are enters the ON state, and the memory cell transistor MT corresponding to the "B" state or the "C" state enters the OFF state. When the read voltage CR is applied to the memory cell transistor MT, the memory cell transistor MT corresponding to the "ER" state, the "A" state, or the "B" state enters the ON state, and the memory cell transistor MT corresponding to the "C" state enters the OFF state. In each of the writing methods, a read pass voltage VREAD is set to a voltage higher than the maximum threshold voltage in the highest threshold voltage distribution. That is, the memory cell transistor MT to which the read pass voltage VREAD is applied to the gate is turned on regardless of data stored therein.

The number of bits of data stored in one memory cell transistor MT described above and the assignment of data to the threshold voltage distribution of the memory cell transistor MT are examples, and are not limited to the above description. For example, data of 3 bits or more may be stored in one memory cell transistor MT, and various other data assignments may be applied to the threshold voltage distribution. The read voltage and read pass voltage may be set to the same voltage value in different methods, or may be set to different voltage values.

For example, as illustrated in FIG. 4, the read pass voltage VREAD in the MLC method may be set to be higher than the read pass voltage VREAD in the SLC method. Similarly, for example, the read pass voltage VREAD in a triple-level cell (TLC) method of storing 3-bit data in one memory cell transistor MT may be set to be higher than the read pass voltage VREAD in the MLC method. The read pass voltage VREAD in a quadruple-level cell (QLC) method of storing 4-bit data in one memory cell transistor MT may be set to be higher than the read pass voltage VREAD in the TLC method.

Figure 5:
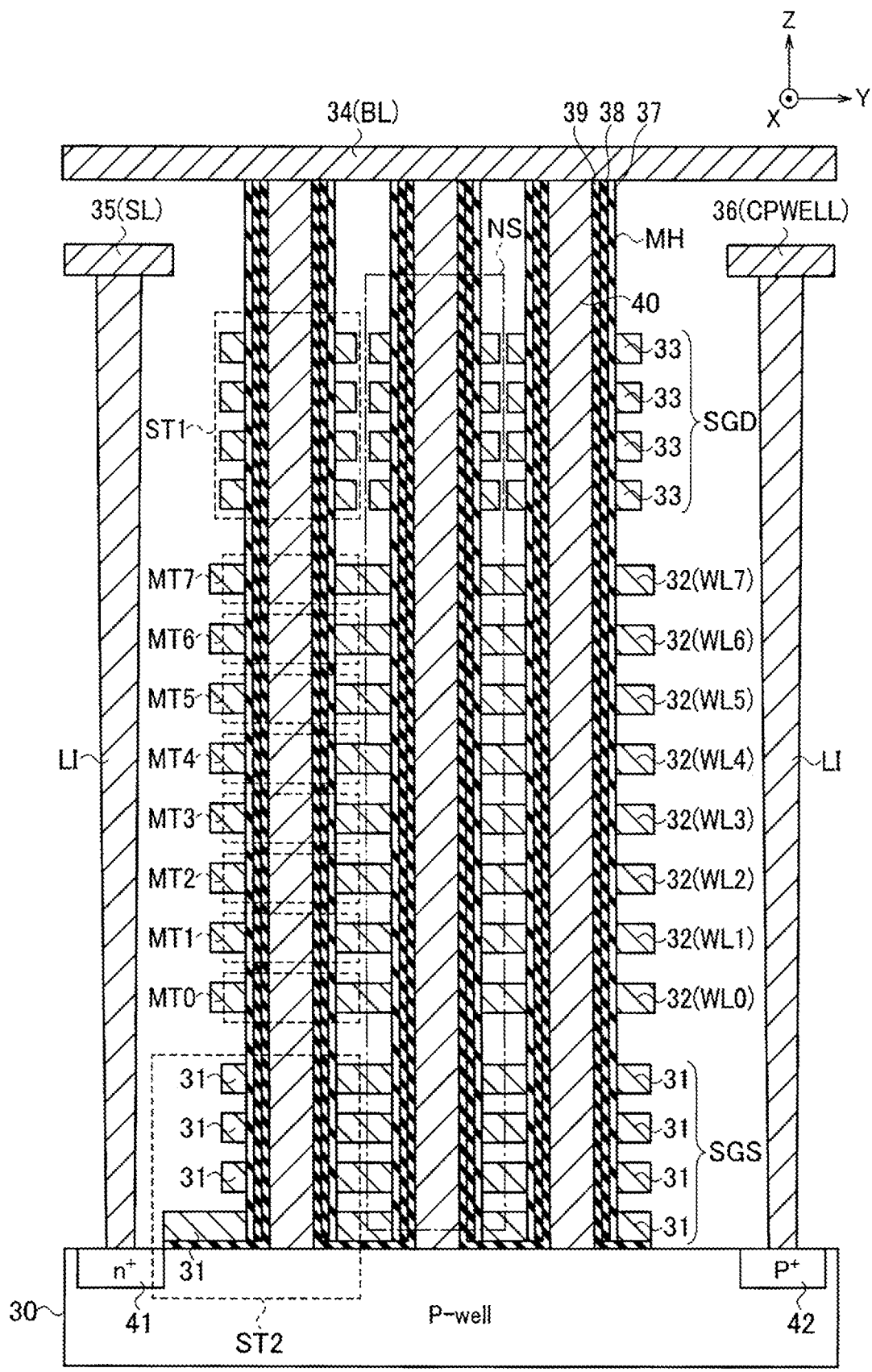
FIG. 5 is a cross-sectional view schematically illustrating an example of a structure of the memory cell array in the NAND flash memory in at least one embodiment.

Next, the cross-sectional structure of the memory cell array will be described with reference to FIG. 5. FIG. 5 is a cross-sectional view illustrating an example of the structure of the memory cell array in the NAND flash memory 10 in the embodiment. FIG. 5 illustrates the cross section of the memory cell array but omits a description of an interlayer insulating film. FIG. 5 also illustrates an X-direction, a Y-direction, and a Z-direction. As illustrated in FIG. 5, the NAND flash memory 10 includes a P-type well region 30, a plurality of conductors 31 to 36, a plurality of semiconductor pillars MH, and a plurality of contact plugs LI.

The P-type well region 30 is formed in the front surface of a semiconductor substrate. Above the P-type well region 30, for example, a four-layer conductor 31, an eight-layer conductor 32, and a four-layer conductor 33 are stacked in order, via the interlayer insulating film. The conductors 31 to 33 are provided in a plate shape extending in the X-direction and the Y-direction, for example. The conductors 31 and 33 function as the select gate lines SGS and SGD, respectively. The conductor 32 functions as the word line WL. One conductor in the stacked conductors 32 is assigned to one word line WL. A part of the plurality of conductors stacked as illustrated in FIG. 5 or a conductor provided in one layer may be assigned to the select gate lines SGS and SGD.

The plurality of semiconductor pillars MH reach the upper surface of the P-type well region 30 from the upper surface of the conductor 33. That is, the semiconductor pillar MH passes through the conductors 31 to 33 in the Z-direction. The semiconductor pillar MH includes a block insulating film 37, an insulating film (charge storage layer) 38, a tunnel oxide film 39, and a semiconductor material 40. The semiconductor material 40 contains a conductive material and is formed in a pillar shape. The tunnel oxide film 39, the insulating film 38, and the block insulating film 37 are formed in this order, to cover the side surface of the semiconductor material 40.

The conductor 34 is formed on a layer above the conductor 33 and the semiconductor pillar MH. The conductor 34 functions as the bit line BL and is connected to the corresponding semiconductor pillar MH. A contact plug containing conductive material may be formed between the conductor 34 and the semiconductor pillar MH.

Conductors 35 and 36 are formed in an interconnection layer between the conductor 33 and the conductor 34. The conductor 35 functions as the source line SL and is connected to an n+ type impurity diffusion area 41 formed in the front surface of the well region 30 via the contact plug LI. The conductor 36 functions as a well line CPWELL and is connected to a p+ type impurity diffusion area 42 formed in the front surface of the well region 30 via the contact plug LI. The contact plugs LI are provided in a plate shape extending in the X-direction and the Z-direction, for example.

In the structure of the memory cell array described above, one semiconductor pillar MH corresponds to one NAND string NS. Specifically, the intersection of the conductor 31 and the semiconductor pillar MH corresponds to the select transistor ST2. The intersection of the conductor 32 and the semiconductor pillar MH corresponds to the memory cell transistor MT. The intersection of the conductor 33 and the semiconductor pillar MH corresponds to the select transistor ST1. The conductor 31 and the tunnel oxide film 39 in the lowermost layer are provided up to the vicinity of the n+ type impurity diffusion area 41. Thus, when the select transistor ST2 enters the ON state, a current path is formed between the NAND string NS and the n+ type impurity diffusion area 41.

A plurality of structures of the memory cell array described above are arranged in the X-direction. For example, one string unit SU includes a set of a plurality of NAND strings NS arranged in the X-direction. When a plurality of string units SU are provided in the same block BLK, the conductor 33 corresponding to the select gate line SGD is separated between the string units SU.

<Reliability Countermeasures Applied to Memory System According to Embodiment>

Various countermeasures are required for ensuring that the NAND flash memory 10 operates in accordance with the specification of a product until the end of the lifetime of the NAND flash memory 10. For this reason, the CPU 21 executes a reliability countermeasure process based on the measurement of the timer 24. The reliability countermeasure process is, for example, an operation that is executed without depending on an instruction from the host device 2 and contributes to the improvement of reliability in the memory system 1.

FIG. 6 illustrates an example of reliability countermeasures applied to the memory system according to the embodiment. FIG. 6 summarizes some events (or problems) that occur in the NAND flash memory 10 in the memory system 1 and countermeasures corresponding to the respective events.

(1) Data Retention

As time elapses after writing data to the memory cell transistor MT, the charge may disappear from the memory cell transistor MT and correct data may be difficult to be read. In order to handle such a situation, patrol read (PR) is performed at predetermined time intervals (for example, every X seconds). In the patrol read, a read operation (sense operation) of data from the memory cell array 11A, an output of the read data (data out operation) to the memory controller 20, and ECC correction on the read data are performed.

(2) First Read

Dummy read (DR) is performed at predetermined time intervals (for example, every Y seconds) in order to secure that a voltage is applied to a word line within a certain time range. In the dummy read, a read operation (sense operation) of data from the memory cell array 11A is performed, but the output of the read data (data out operation) to the memory controller 20 is not performed.

(3) Read Disturb

When data is written to a memory cell transistor MT, and then a read operation is repeated on a block BLK that includes the memory cell transistor MT, charges are injected into the memory cell transistor MT resulting in a change of the threshold voltage, and thus it may be difficult to read correct data therefrom. In order to handle such a situation, when the number of times of read operations (referred to as a read disturb count) on a certain region (for example, block BLK) exceeds a predetermined threshold value, scan read (SR) is performed on this region, and if necessary, a refresh operation is performed on the region. In the scan read, a read operation (sense operation) of data from the memory cell array 11A, an output operation of the read data (data out operation) to the memory controller 20, and ECC correction of the read data may be performed. In the refresh operation, data having been subjected to the ECC correction is written back to the memory cell array 11A. The write-back may be performed on the same region as the region in which the data has been read, or may be performed on a region different from the region in which the data has been read.

(4) Concentration of Program/Erase (P/E) Cycle

A wear leveling operation may be performed. In the wear leveling operation, hot data is transferred to a block in which cold data is written, that is, a block in which the number of P/E cycles is small, and cold data is transferred to a block in which hot data is written, that is, a block in which the number of P/E cycles is large. That is, the concentration of the P/E cycle in a specific region (for example, block) is avoided, and the lifetime of the entirety of the NAND flash memory 10 is extended.

(5) Temperature Change During Read Time/Write Time

When the temperature differs between a time of a read operation (read time) and a time of a write operation (write time), a read voltage is to be appropriately set in consideration of a temperature difference.

The above-described countermeasures for data retention and first read are triggered by an elapse of time. The countermeasure for read disturb is triggered by an occurrence of an event.

Some of the countermeasures may be replaced by a pre-process for the NAND flash memory 10, such as host read (HR) instructed by the host device 2 or compaction read (CR). Alternatively, some of the countermeasures may be replaced by other countermeasures performed for the NAND flash memory 10.

In addition to (1) to (5) described above, the CPU 21 may also execute various processes for managing the NAND flash memory 10. For example, when the number of free blocks falls below a predetermined threshold number, the CPU 21 may execute compaction (also referred to as "garbage collection") that does not depend on an instruction from the host device 2 so as to instruct the NAND flash memory 10 to perform a data erase operation.

Figure 7:
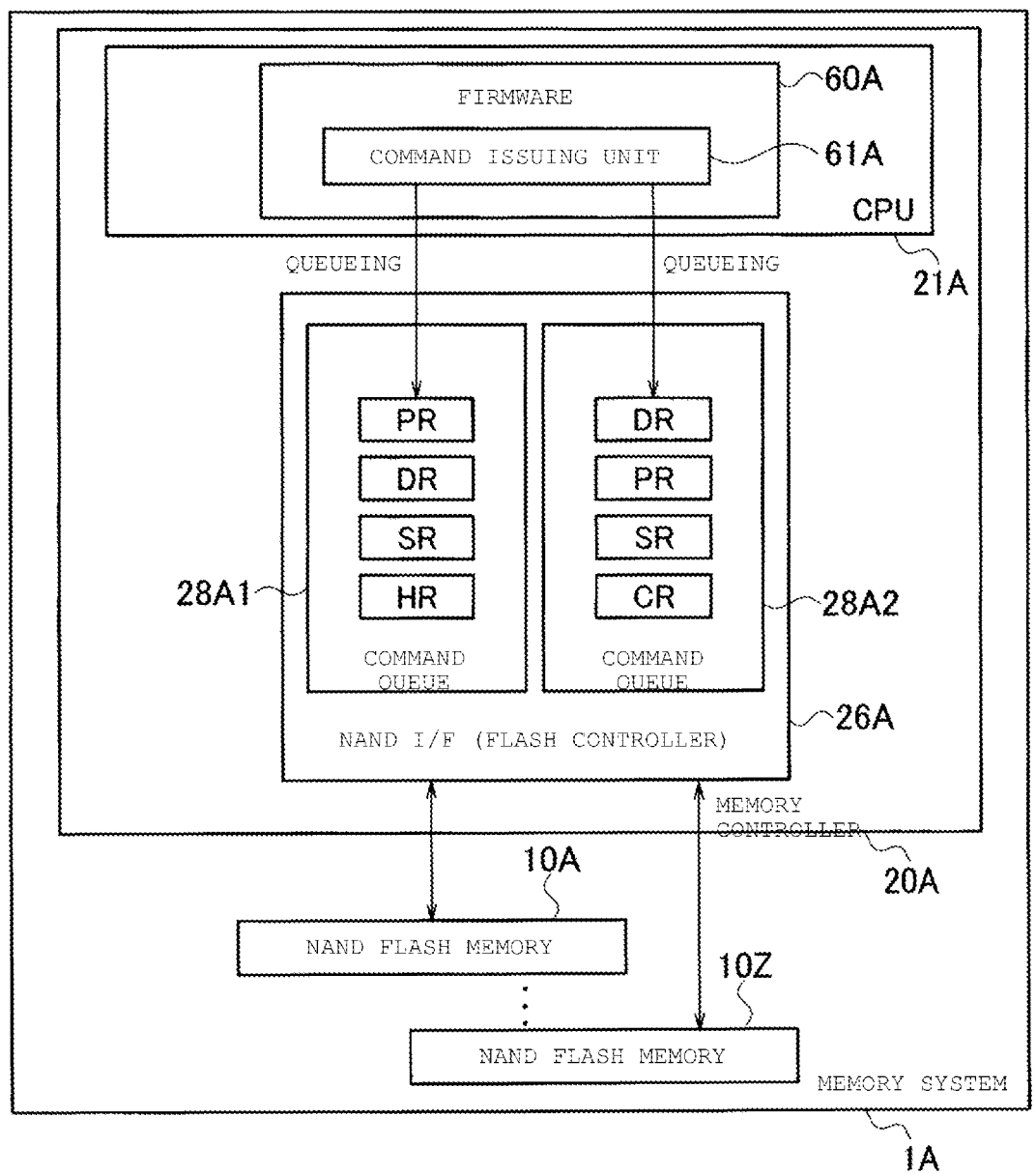
FIG. 7 is a schematic block diagram illustrating an operation example of reliability countermeasures by a memory system according to a comparative example.

Operation Example of Reliability Countermeasures by Memory System According to Comparative Example FIG. 7 is a schematic block diagram illustrating an operation example of reliability countermeasures by a memory system LA according to a comparative example.

The memory system 1A according to the comparative example includes NAND flash memories 10A to 10Z and a memory controller 20A. The memory controller 20A includes a firmware module 60A including a command issuing unit 61A and a NAND interface circuit 26A. The NAND interface circuit 26A includes command queues 28A1 and 28A2 for queuing commands for instructing execution of the reliability countermeasure process.

In the example illustrated in FIG. 7, the command issuing unit 61A queues commands of host read (HR), scan read (SR) for read disturb countermeasures, dummy read (DR) for first read countermeasures, and patrol read (PR) for data retention countermeasures, in the command queue 28A1 in this order. The command issuing unit 61A queues commands of compaction read (CR), scan read (SR) for read disturb countermeasures, patrol read (PR) for data retention countermeasures, and dummy read (DR) for first read countermeasures, in the command queue 28A2 in this order. The order of the commands to be queued is not limited to the example illustrated in FIG. 7. The command is queued each time a predetermined time elapses or a predetermined event occurs. The number of commands queued in the command queues 28A1 and 28A2 is not limited to the example of FIG. 7. More commands may be queued as long as the depth (size) of the command queues 28A1 and 28A2 is sufficient. The number of command queues 28A1 and 28A2 is not limited to two.

The command issuing unit 61A of the firmware module 60A in the comparative example performs scheduling of the various countermeasures illustrated in FIG. 6 such that they are executed regardless of whether or not the countermeasures are actually required. The command issuing unit 61A performs scheduling independently for each type of countermeasure. Therefore, even though the events of the patrol read (PR) for data retention countermeasures, the dummy read (DR) for first read countermeasures, and the scan read (SR) for read disturb countermeasures overlap with each other, the command issuing unit 61A performs scheduling independently for each of the countermeasures. Even though the pre-process for the NAND flash memory 10, such as host read (HR) or compaction read (CR) overlaps some of the various countermeasures illustrated in FIG. 6, the command issuing unit 61A performs scheduling independently for each of the countermeasures. Thus, when the host read (HR)/compaction read (CR) targets a certain page, the scan read (SR), the patrol read (PR), or the dummy read (DR) are performed unconditionally even though it is not necessary to perform them on the same page immediately after the page is set as the target. As a result, there is a possibility that adverse effects such as an increase of load and a decrease of a processing speed may occur due to the unnecessary countermeasure process. Since the patrol read (PR), the dummy read (DR), or the like is unnecessarily performed, an excessive load may be applied to the memory cell, and thus the reliability of the memory system LA is impaired.

<Reliability Countermeasures by Memory System According to Embodiment>

The embodiment provides intelligent scheduling for optimally operating the reliability countermeasure process for the NAND flash memory 10.

Figure 8:
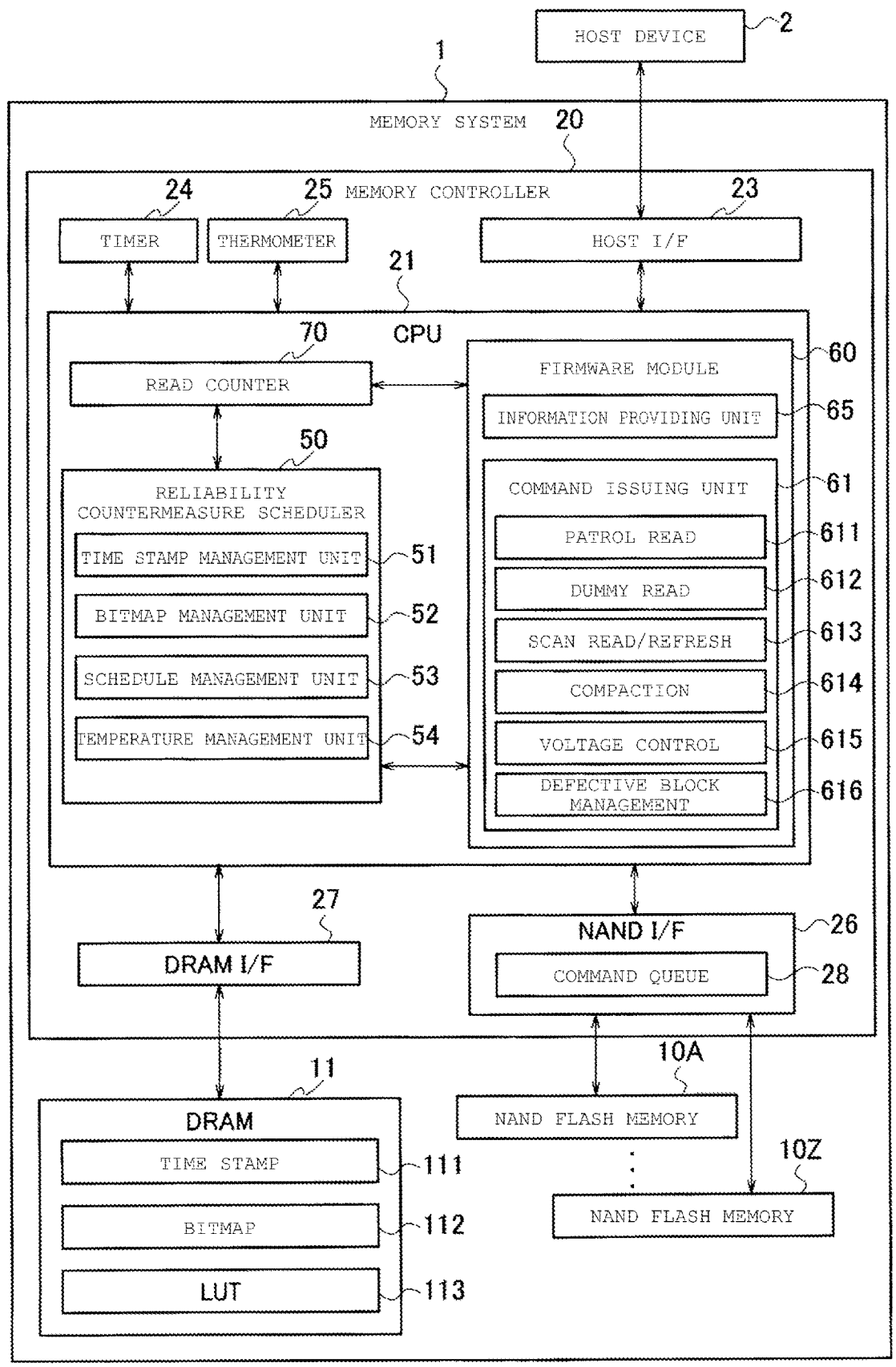
FIG. 8 is a schematic block diagram illustrating a detailed configuration example of a memory controller in the memory system according to at least one embodiment.

FIG. 8 illustrates a detailed configuration example of the memory system 1 according to at least one embodiment and the memory controller 20 in the memory system 1. Description of the components that overlap with those described with reference to FIG. 1 will not be repeated.

As illustrated in FIG. 8, the memory system 1 includes the NAND flash memory 10 (10A to 10Z) and the memory controller 20. The memory controller includes a reliability countermeasure scheduler 50 and a firmware module 60. The reliability countermeasure scheduler 50 performs scheduling of the reliability countermeasure process for the NAND flash memory 10. The firmware module 60 controls the execution of the reliability countermeasure process in accordance with the scheduling by the reliability countermeasure scheduler 50. The reliability countermeasure scheduler 50 tracks an access process executed to the NAND flash memory 10. When the target of a reliability countermeasure is properly and sufficiently achieved by the access process executed prior to a newly generated reliability countermeasure which is planned to be executed, or by the access process being in progress, the reliability countermeasure scheduler performs scheduling of the reliability countermeasure process to avoid (for example, skip) the reliability countermeasure process. Here, the "access process executed to the NAND flash memory 10" tracked by the reliability countermeasure scheduler 50 includes, for example, a foreground process such as host read, and a background process such as compaction read, scan read for read disturb countermeasures, dummy read for first read countermeasures, and patrol read for data retention countermeasures. The "newly generated reliability countermeasure planned to be executed" includes, for example, scan read for read disturb countermeasures, dummy read for first read countermeasures, and patrol read for data retention countermeasures. The "access process being in progress" includes, for example, a process queued in the command queue 28.

The reliability countermeasure scheduler 50 determines whether to execute or skip the reliability countermeasure process with reference to a time stamp table 111. In the time stamp table, the latest execution time of the reliability countermeasure process is recorded, per predetermined memory region unit of the NAND flash memory 10, for each type of the reliability countermeasure process.

The reliability countermeasure scheduler 50 compares the latest execution time of the reliability countermeasure process planned to be executed with the current time. When a difference between the latest execution time and the current time is equal to or greater than a value of a predetermined time limit, the reliability countermeasure scheduler instructs the firmware module 60 to execute the reliability countermeasure process planned to be executed. The predetermined time limit is defined for each type of reliability countermeasure, for example. The current time means, for example, the elapsed time (POS) after the power of the memory system 1 is turned on. The latest execution time of the access process means, for example, the elapsed time after the power of the memory system 1 is turned on until when the latest access process is completed.

The reliability countermeasure scheduler 50 skips the reliability countermeasure process, for example, by rewriting the latest execution time of the reliability countermeasure process, which has become unnecessary due to the execution of the access process, to the time at which the access process is completed.

The reliability countermeasure scheduler 50 determines whether or not to execute the reliability countermeasure process, with reference to a bitmap table 112 in which a bit value indicating whether or not the reliability countermeasure process is to be executed is recorded for each type of reliability countermeasure process.

More specifically, as illustrated in FIG. 8, the memory system 1 includes the NAND flash memories 10A to 10Z, the DRAM 11, and the memory controller 20. The memory controller 20 includes the CPU 21, the host interface circuit 23, the timer 24, the thermometer 25, the NAND interface circuit 26, and the DRAM interface circuit 27.

The NAND interface circuit 26 includes a command queue for queuing commands for instructing execution of the reliability countermeasure process. The DRAM 11 stores the time stamp table 111, the bitmap table 112, a look-up table (LUT) 113, and the like, which will be described later.

The CPU 21 functions as the reliability countermeasure scheduler 50, the firmware module 60, and a read counter 70 by executing the firmware.

The firmware module 60 includes the command issuing unit 61 and an information providing unit 65 in order to control the execution of the reliability countermeasure process in accordance with the scheduling of the reliability countermeasure scheduler 50.

The command issuing unit 61 queues a command for instructing execution of the reliability countermeasure process in the command queue 28 of the NAND interface circuit 26. The command issuing unit 61 includes a patrol read unit 611 that controls a patrol read operation of the data retention countermeasure, a dummy read unit 612 that controls a dummy read operation of the first read countermeasure, a scan/refresh unit 613 that controls the scan read/refresh of the read disturb countermeasure, a compaction unit 614 that controls wear leveling and compaction, a voltage control unit 615 that controls voltage in response to a temperature change between a read time a the write time, and a defective block management unit 616 that manages a defective block.

The information providing unit 65 provides the reliability countermeasure scheduler 50 and the read counter 70 with information regarding an operation of a process such as host read, program, and erase on the NAND flash memory 10. Some of the process is instructed from the host device 2 via the host interface circuit 23.

The read counter 70 counts the number of times of read operations (read disturb count) for the NAND flash memory 10, for example, in page units, based on the information provided by the information providing unit 65.

The reliability countermeasure scheduler 50 includes a time stamp management unit 51, a bitmap management unit 52, a schedule management unit 53, and a temperature management unit 54.

The time stamp management unit 51, for example, sets/resets the time stamp table 111 stored in the DRAM 11 based on information such as the information provided by the information providing unit 65 and POS information provided by the timer 24.

The bitmap management unit 52, for example, sets/resets the bitmap table 112 stored in the DRAM 11 based on information such as the information provided by the information providing unit 65, the number of times of read operations, which is provided by the read counter 70, and the POS information provided by the timer 24.

Although FIG. 8 illustrates an example in which the time stamp table 111 and the bitmap table 112 are stored in the DRAM 11, the time stamp table 111 and the bitmap table 112 may be stored in the built-in memory 22 of the memory controller 20, for example.

The schedule management unit 53 optimizes the schedule of the reliability countermeasure process for the NAND flash memory 10, based on information such as the information provided by the information providing unit 65, the number of times of read operations, which is provided by the read counter 70, the POS information provided by the timer 24, and the temperature provided by the thermometer 25.

The temperature control unit 54 appropriately sets the read voltage based on information such as the information provided by the information providing unit 65 and the temperature provided by the thermometer 25, in consideration of the temperature difference between the read time and the write time.

The reliability countermeasure scheduler 50 tracks the reliability countermeasures executed by the firmware module 60 for the NAND flash memory 10. When a new reliability countermeasure which is required to be executed on a certain region (for example, page or block) of the NAND flash memory 10, the reliability countermeasure scheduler 50 skips the execution of the new reliability countermeasure when the target thereof is properly and sufficiently achieved by an access process having been executed on the region prior to the new reliability countermeasure or by an access process being in progress. For example, when the host read/compaction read targets a certain page, it is not necessary to perform the scan read for read disturb countermeasures, the patrol read for data retention countermeasures, or the dummy read for first read countermeasures, on the same page immediately after the host read/compaction read. Thus, the execution of the unnecessary processes may be skipped. As a result, it is possible to remove the possibility that adverse effects such as an increase of load and a decrease of a processing speed may occur due to the unnecessary countermeasure process. Since the unnecessary patrol read, dummy read, and the like are skipped, it is possible to avoid applying an excessive load to the memory cell and to improve the reliability of the memory system 1.

The reliability countermeasures targeted in the embodiment are not limited to those described in the present specification and the drawings. Similarly, other reliability countermeasures to be performed to maintain/improve the reliability of the NAND flash memory 10 and the memory system 1 may also be applied.

The reliability countermeasure scheduler 50, the firmware module 60, and the read counter 70 are implemented by the CPU 21 executing the firmware, but some or all of the reliability countermeasure scheduler 50, the firmware module 60, and the read counter 70 may be implemented by dedicated hardware. Alternatively, the host interface circuit 23, the NAND interface circuit 26, and the DRAM interface circuit 27 may be implemented by the CPU 21 executing the firmware, and some or all of the host interface circuit 23, the NAND interface circuit 26, and the DRAM interface circuit 27 may be implemented by dedicated hardware.

Figure 9:
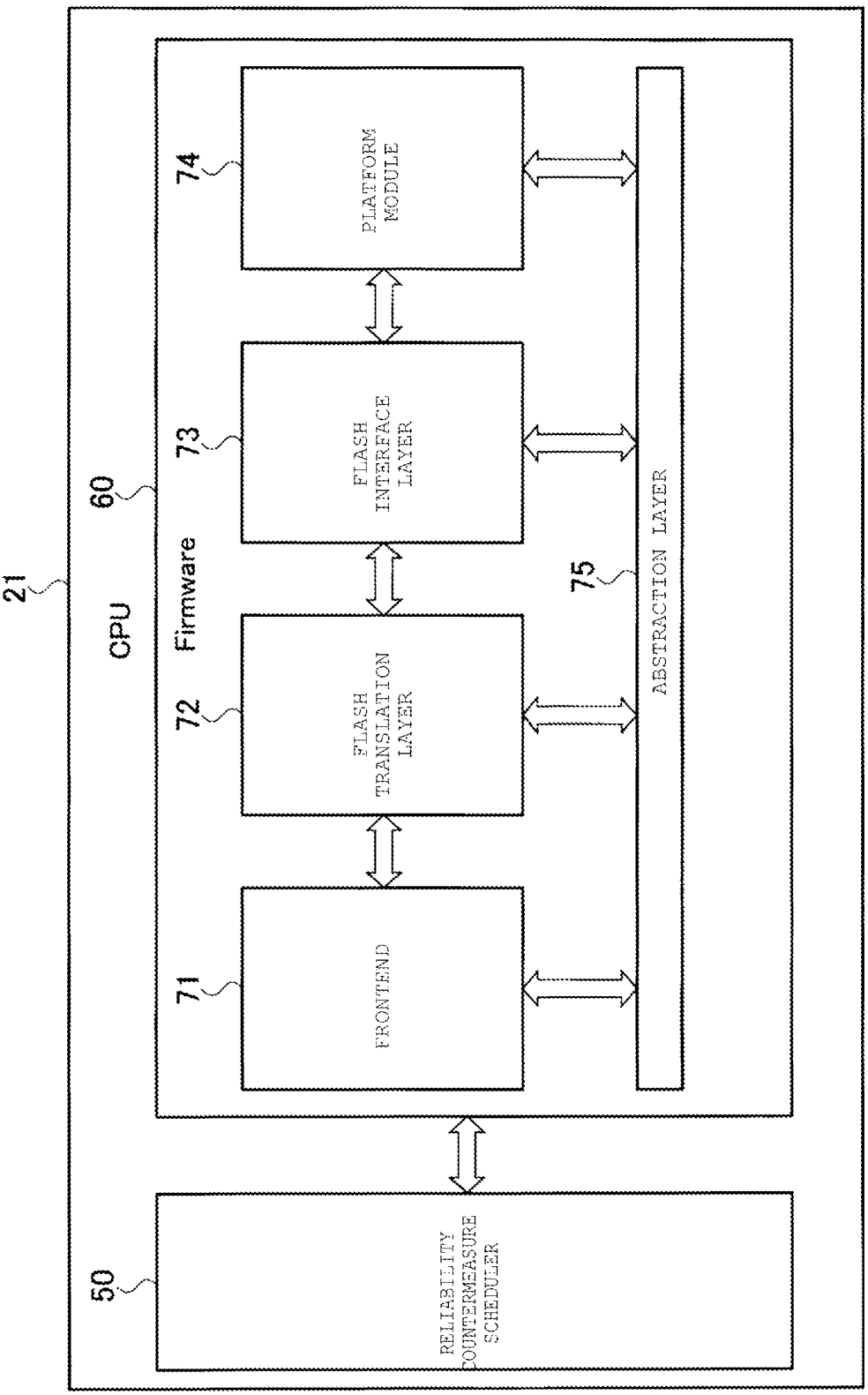
FIG. 9 is a schematic block diagram illustrating an example of each layer in a firmware module in the memory controller in at least one embodiment.

FIG. 9 illustrates an example of each layer in the firmware module 60 in the memory controller 20 in the embodiment.

The firmware module 60 includes a frontend 71 that performs Nonvolatile memory express (NVMe) command processing and the like, a flash translation layer (FTL) 72 that manages the LUT, a flash medium, and the like, a flash interface layer 73 that performs command dispatch to the NAND memory, a platform module 74 that controls a timer, interruption, and the like, and an abstraction layer 75 that abstracts hardware.

<Time Stamp and Bitmap>

In at least one embodiment, the time stamp table 111 and the bitmap table 112 are used to provide scheduling for optimally operating the reliability countermeasure process for the NAND flash memory 10. FIGS. 10 and 11 illustrate examples of tables in which the time stamp and the bitmap used in scheduling of the reliability countermeasures are stored, in at least one embodiment. FIG. 10 illustrates an example of the table used in scheduling of the reliability countermeasures in page units. FIG. 11 illustrates an example of the table used in scheduling in block units. FIG. 12 illustrates an example of setting a time stamp in the time stamp table 111.

The reliability countermeasure scheduler 50 uses a single or a plurality of bitmaps for each size required for tracking the access process executed or the access process in progress for the NAND flash memory 10. The bits in the bitmap are set to "0" (not-target)/"1" (target) in accordance with the type of countermeasure and the time interval.

For example, in FIG. 10, regarding the bitmap of the patrol read for data retention countermeasures, "1" (target) is set in each of the bits corresponding to targets of the patrol read, which are pages Page_1, Page_(n−1), and Page_n. In each of the bitmaps corresponding to other pages, "0" (not-target) is set. Similarly, regarding the scan read for read disturb countermeasures, when the read disturb count exceeds a predetermined threshold value, "1" (target) is set in each of the bits corresponding to targets of the scan read for read disturb countermeasures, which are pages Page_1 and Page_(n−1). In each of the bitmaps corresponding to other pages, "0" (not-target) is set.

Similarly, in FIG. 11, regarding the dummy read for first read countermeasures, "1" (target) is set in each of the bits corresponding to targets of the dummy read, which are blocks Block_1, Block_(m−1), and Block_m. In each of the bitmaps corresponding to other blocks, "0" (not-target) is set.

The reliability countermeasure scheduler 50 uses the time stamp table 111, for example, in order to track whether or not the effect of the access process which is previously executed is still effective for a certain page. The time stamp table 111 is set for each reliability countermeasure. The reliability countermeasure process targeting the page, which is to be executed before the effect expires in the time stamp table 111, is skipped.

For example, the time stamp table 111 in FIG. 10 records the time stamps of all pages Page_1, Page_2, Page_(n−1), and Page_n. For example, regarding the time stamps of the patrol read for data retention countermeasures, time stamps $TS\_PR_1$, $TS\_PR_2$, $TS\_PR_{(n-1)}$, and $TS\_PR_n$ of the respective pages Page_1, Page_2, Page_(n−1), and Page_n are recorded. The value of the time stamp recorded here is the execution completion time of the latest patrol read executed for each page, and the value of POS is used. For example, data indicating the execution completion time of the latest patrol read executed for the page Page_1, that is, data indicating how many seconds after the power-on of the memory system 1 have elapsed until the execution of the latest patrol read on the page Page_1 is completed is recorded in the time stamp $TS\_PR_1$.

In the example in FIG. 12, the latest patrol read for the page Page_1 is completed at a time T12, that is, when 3 seconds elapses (POS=3 seconds) after the power of the memory system 1 is turned on at a time T10. Thus, "3" is set in the time stamp $TS\_PR_1$. Similarly, the latest patrol read for the page Page_2 is completed at a time T14, that is, when 6 seconds elapses (POS=6 seconds) after the power of the memory system 1 is turned on at the time T10. Thus, "6" is set in the time stamp $TS\_PR_2$. Here, an example in which one count of POS is 1 second is described, but the embodiments are not limited to this. The length of one count of POS may be appropriately set.

The reliability countermeasure scheduler 50 determines the difference between the current POS measured by the timer 24 and the time stamp recorded in the time stamp table 111 for all the time stamps recorded in the time stamp table 111. When the difference between the current POS and the time stamp is greater than the time limit that is preset for each reliability countermeasure, the reliability countermeasure scheduler 50 determines that the reliability countermeasure is required, and instructs the firmware module 60 to execute the reliability countermeasure. The reliability countermeasure scheduler 50 updates the value of the time stamp recorded in the time stamp table 111 to the current POS value.

The reliability countermeasure scheduler 50 updates the time stamps of other reliability countermeasures that are no longer required by executing this reliability countermeasure. Other reliability countermeasures scheduled within the above time limit are no longer necessary and can be skipped.

The bitmap stored in the bitmap table 112 and the time stamp stored in the time stamp table 111 are cleared when there is no valid data on the target page or block. As a cause of no valid data, for example, a case where a data erase operation is performed to a block, a case where data becomes unnecessary or invalid, or a case where a block becomes a defective block is assumed. When a block becomes a defective block, the bitmap and the time stamp corresponding to the block may be deleted, and thus it is possible to save a space required to store the time stamp table 111/bitmap table 112.

Figure 13:
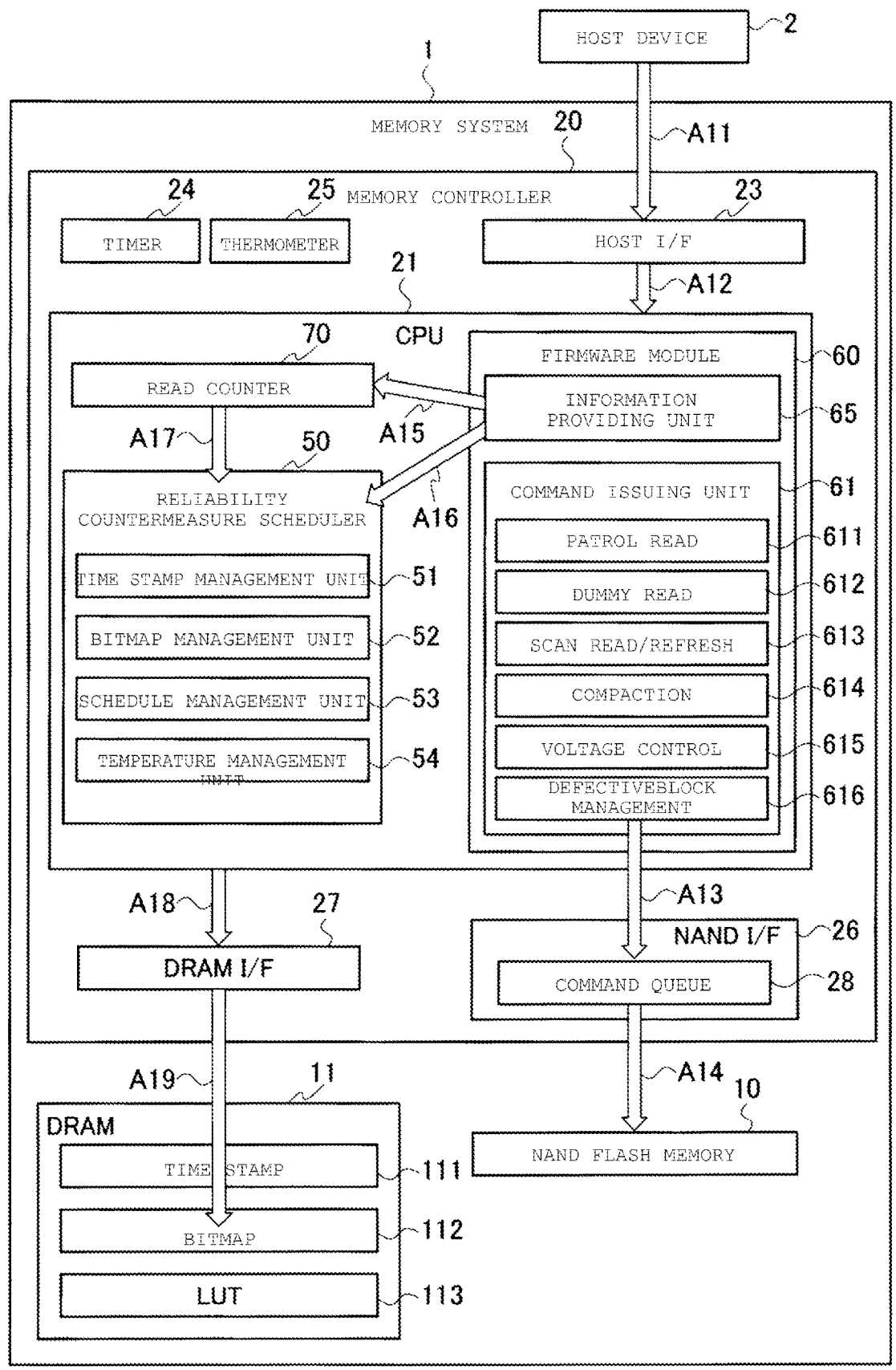
FIG. 13 is a schematic block diagram illustrating a timing example of setting/resetting the bitmap by the memory controller in at least one embodiment.

FIG. 13 is a diagram illustrating a timing example of setting/resetting the bitmap by the memory controller 20 in the embodiment.

The reliability countermeasure scheduler 50 sets/resets the bitmap of the bitmap table 112, for example, at the following timing, based on detailed information regarding the page of the NAND flash memory 10, which is transmitted from the information providing unit 65 in the firmware module 60.

(1) The bit corresponding to a page or block of the NAND flash memory 10, which is programmed based on an instruction from the host device 2 (A11→A12→A13→A14), is set to "1" (A18→A19). For example, the bitmap of the patrol read or the dummy read is set. Information indicating the address and the like of the target page of the NAND flash memory 10 programmed based on the instruction from the host device 2 is transmitted from the information providing unit 65 to the reliability countermeasure scheduler 50 (A16).

(2) When the counter value measured by the read counter (A15) is determined, based on the information from the information providing unit 65, to exceed a predetermined threshold value, the bit corresponding to the page is set to "1" (A18→A19). For example, the bitmap of the scan read is set.

(3) The bits corresponding to a page invalidated by compaction or a block such as an erased block or a defective block are reset to "0" (A16→A18→A19). Bitmaps of the patrol read, the scan read, and the dummy read are to be reset, for example.

(4) The bit corresponding to the internal write by the firmware module 60 (e.g., compression write or writing to the LUT) is set/reset (A16→A18→A19).

Note that regardless of the foreground process/background process, the reliability countermeasure scheduler 50 does not update the bitmap of the bitmap table 112 so long as there is no access to the NAND flash memory 10.

Figure 14:
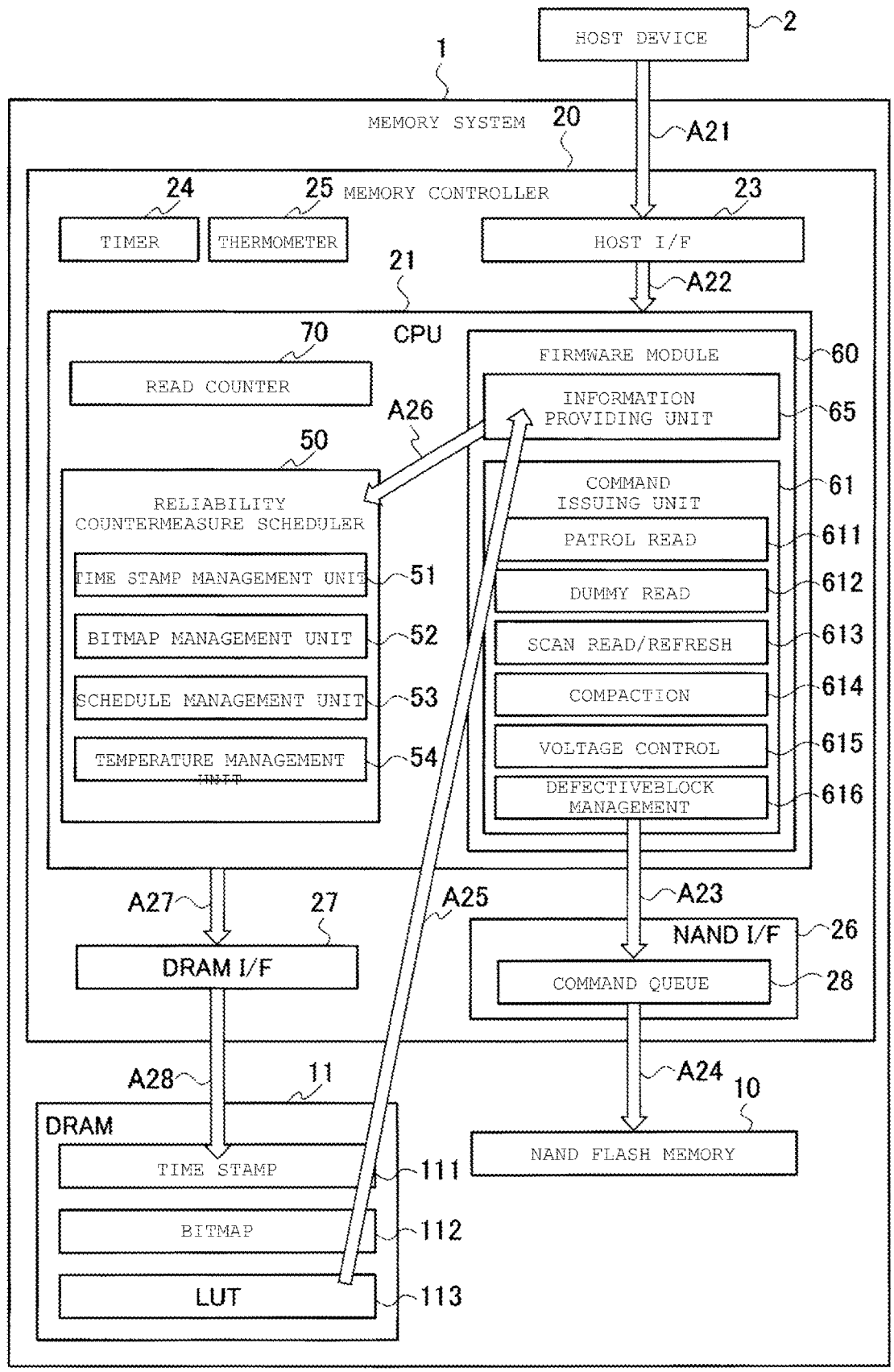
FIG. 14 is a schematic block diagram illustrating a timing example of setting/resetting the time stamp by the memory controller in at least one embodiment.

FIG. 14 is a diagram illustrating a timing example of setting/resetting the time stamp by the memory controller 20 in at least one embodiment.

The reliability countermeasure scheduler 50 sets/resets the time stamp of the time stamp table 111, for example, at the following timing, based on the detailed information regarding the page of the NAND flash memory 10, which is transmitted from the information providing unit 65 in the firmware module 60.

(1) In the time stamps corresponding to a page and a block of the NAND flash memory 10, to which the host read is performed based on an instruction from the host device 2 (A21→A22→A23→A24), the current time (for example, the current POS) is set (A25→A26→A27→A28). Time stamps of the patrol read, the scan read, and the dummy read are set, for example.

(2) In the time stamps corresponding to a page and a block to which the internal read (compaction read or LUT read), the patrol read, the scan read, or the like is performed by the firmware module 60, the current time (for example, the current POS) is set (A25→A26→A27→A28). Time stamps of the patrol read, the scan read, and the dummy read are set, for example.

(3) In the time stamp corresponding to a page and a block to which the dummy read is performed by the firmware module 60, the current time (for example, the current POS) is set (A25→A26→A27→A28).

The current time may be set in all types of countermeasures by executing a certain process (for example, host read, internal read, or patrol read). The current time may be set only in the time stamps of some types of countermeasures by executing another certain process (for example, dummy read). Details will be described later.

Note that regardless of the foreground access process/background access process, the reliability countermeasure scheduler 50 does not update the time stamp of the time stamp table 111 so long as there is no access to the NAND flash memory 10.

<Scheduling of Patrol Read>

Figure 15:
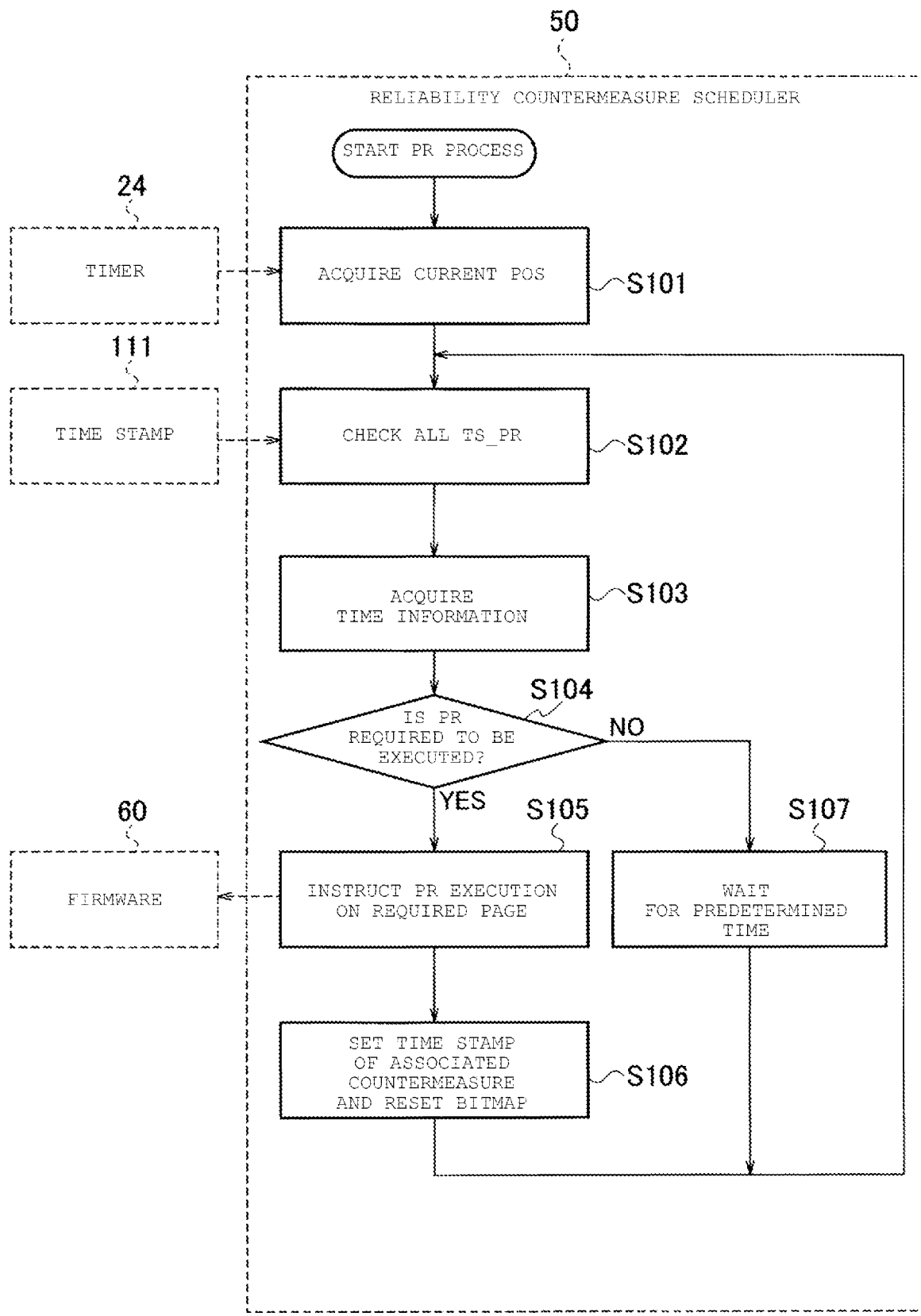
FIG. 15 is a schematic flowchart illustrating an example of a patrol read scheduling process by a reliability countermeasure scheduler in at least one embodiment.

FIG. 15 illustrates an example of a patrol read scheduling process by the reliability countermeasure scheduler 50 in the embodiment.

The reliability countermeasure scheduler 50 determines whether or not the patrol read is required in accordance with the following processes.

In Step S101, the reliability countermeasure scheduler 50 acquires the current time, for example, the current POS from the timer 24.

In Step S102, the reliability countermeasure scheduler 50 acquires time stamps $TS\_PR_1$, $TS\_PR_2$, ..., $TS\_PR_{(n-1)}$, $TS\_PR_n$ related to the patrol read from the time stamp table 111. At this time, the reliability countermeasure scheduler 50 also refers to the bitmap BM_PR of the patrol read in the bitmap table 112, which corresponds to the time stamps $TS\_PR_1$, $TS\_PR_2$, ..., $TS\_PR_{(n-1)}$, and $TS\_PR_n$. The reliability countermeasure scheduler 50 acquires only the time stamp TS_PR of a page in which the bitmap BM_PR of the patrol read is "1" (target). Here, an example of acquiring the time stamp TS_PR for all pages in which the bitmap BM_PR is "1" (target) is described. However, in accordance with the specifications of the memory system 1, the time stamp TS_PR of some pages among pages in which the bitmap BM_PR is "1" may be acquired.

Then, in Step S103, the reliability countermeasure scheduler 50 compares the acquired time stamps $TS\_PR_1$, $TS\_PR_2$, ..., $TS\_PR_{(n-1)}$, $TS\_PR_n$, with the current POS in page units. In Step S104, the reliability countermeasure scheduler 50 determines whether or not the patrol read is required, in page units.

In the determination process of Step S104, for example, when Expression 1 is satisfied for any "page k", the reliability countermeasure scheduler 50 determines that the patrol read is required for the "page k".

$$(\text{Current POS–time stamp } TS\_PR_k) \geq (\text{predetermined time limit}) \quad \text{(Expression 1)}$$

Here, "(current POS–time stamp $TS\_PR_k$)" means the length (e.g., in seconds) of the time elapsed after the latest patrol read executed for the "page k" (the k-th page) is completed. The "predetermined time limit" is a threshold time for which the countermeasures are required to be executed, which is determined for each reliability countermeasure. Thus, when the value of (current POS–time stamp $TS\_PR_k$) is equal to or greater than the value of the "predetermined time limit", the reliability countermeasure scheduler 50 determines that the patrol read is required to be executed for the "page k".

Regarding the page (that is, the page k) determined to require the patrol read to be executed as a result of the determination process in Step S104 (YES in Step S104), in Step S105, the reliability countermeasure scheduler 50 instructs the firmware module 60 to execute the patrol read for the page k. The command issuing unit 61 of the firmware module 60, which has received the instruction, queues the command for executing the patrol read for the page, in the command queue 28 of the NAND interface circuit 26.

Following the process in Step S105, or simultaneously with the process in Step S105, the reliability countermeasure scheduler 50 sets the current POS in the time stamp TS_PR (for example, $TS\_PR_k$) of the page (for example, page k) on which the patrol read is to be executed, in Step S106.

In Step S106, the reliability countermeasure scheduler 50 sets the current POS in the time stamps of other types of reliability countermeasures which can be skipped by executing the patrol read, that is, the time stamps of other types of reliability countermeasures that do not need to be executed. In this manner, it is possible to determine that the countermeasure process is completed for other types of reliability countermeasures that can be skipped. Other types of reliability countermeasures that can be skipped by executing the patrol read are, for example, the scan read and the dummy read. The current POS is also set in the time stamps of the scan read and the dummy read accordingly.

Thus, it is possible to skip the execution of unnecessary countermeasure process for the same page or block. As a result, it is possible to remove the possibility that adverse effects such as an increase of load and a decrease of a processing speed may occur due to the unnecessary countermeasure process. It is possible to avoid imposing of an excessive load to the memory cell and to improve the reliability of the memory system 1, by skipping the unnecessary read operation and the like.

Regarding the page determined not to require the patrol read to be executed as the result of the determination process in Step S104 (NO in Step S104), the process returns to Step S102 after a wait for a predetermined time in Step S107 (for example, one second).

Figure 16:
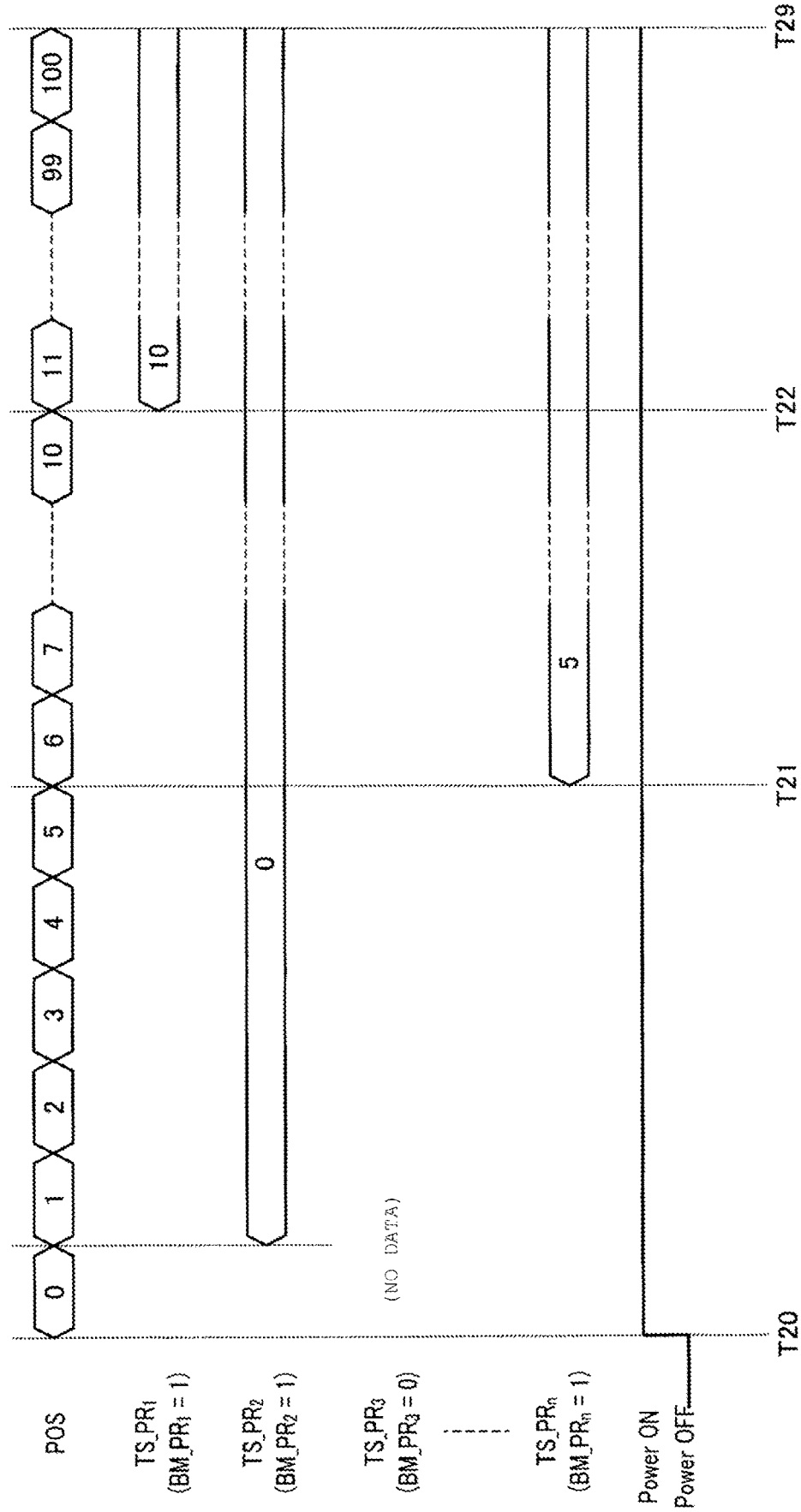
FIG. 16 is a diagram more specifically illustrating the patrol read scheduling process illustrated in FIG. 15.

FIG. 16 is a diagram more specifically illustrating the patrol read scheduling process illustrated in FIG. 15. In the example illustrated in FIG. 16, the power of the memory system 1 is turned on at a time T20 (POS=0 seconds), and the POS at the current time T29 is 100 seconds (POS=100 seconds). The predetermined time limit here is 95 seconds. FIG. 16 illustrates a specific example, and the embodiments are not limited to this example.

Here, among the time stamps $TS\_PR_1$, $TS\_PR_2$, $TS\_PR_3$, $TS\_PR_n$, the bitmap of the time stamp $TS\_PR_3$ is set to be "0" (not-target). In the process of Step S102, the time stamp $TS\_PR_3$ is excluded from the target.

Here, it is assumed that, among the time stamps $TS\_PR_1$, $TS\_PR_2$, and $TS\_PR_n$ in which the corresponding bitmap values are "1" (target), "10" is set in the time stamp $TS\_PR_1$, "0" is set in the time stamp $TS\_PR_2$, and "5" is set in the time stamps $TS\_PR_n$.

The determination process of Step S104 is executed for each of the time stamps $TS\_PR_1$, $TS\_PR_2$, and $TS\_PR_n$. Regarding the time stamp $TS\_PR_1$, (current POS–time stamp $TS\_PR_1$) (=90 seconds)<(predetermined time limit) (=95 seconds), and thus it is determined that the patrol read is unnecessary. That is, since only 90 seconds passes after the last patrol read is executed, it is determined that the elapse time does not reach the predetermined time limit (=95 seconds).

Regarding the time stamp $TS\_PR_2$, (current POS–time stamp $TS\_PR_2$) (=100 seconds)>(predetermined time limit) (=95 seconds), and thus it is determined that the patrol read is necessary. That is, regarding the time stamp $TS\_PR_2$, since the patrol read is never executed after the power of the memory system 1 is turned on, and the elapse time exceeds the predetermined time limit, it is determined that the patrol read is necessary.

Regarding the time stamp $TS\_PR_n$, (current POS–time stamp $TS\_PR_n$) (=95 seconds)=(predetermined time limit) (=95 seconds), and thus it is determined that the patrol read is necessary. That is, regarding the time stamp $TS\_PR_n$, 95 seconds passes after the last patrol read is executed. Thus, it is determined that the elapse time reaches the predetermined time limit (=95 seconds).

<Scheduling of Scan Read>

Figure 17:
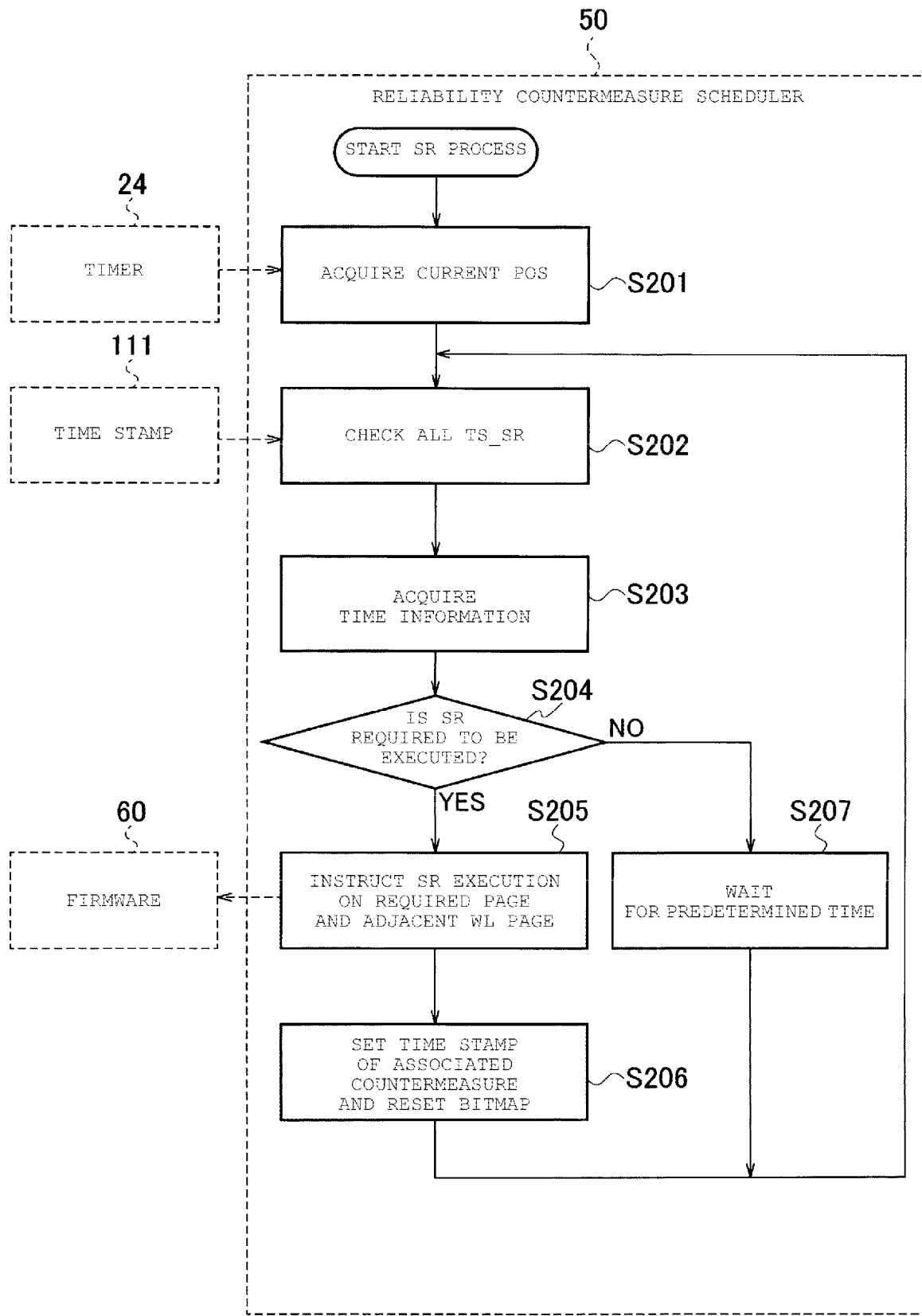
FIG. 17 is a schematic flowchart illustrating an example of a scan read scheduling process by the reliability countermeasure scheduler in at least one embodiment.

FIG. 17 illustrates an example of a scan read scheduling process by the reliability countermeasure scheduler 50 in at least one embodiment. The description of processes similar to those in the scheduling process illustrated in FIG. 15 will be simplified or omitted.

In Step S201, the reliability countermeasure scheduler 50 acquires the current POS from the timer 24.

In Step S202, the reliability countermeasure scheduler 50 acquires time stamps $TS\_SR_1$, $TS\_SR_2$, ..., $TS\_SR_{(n-1)}$, $TS\_SR_n$ related to the scan read from the time stamp table 111. In this case, the reliability countermeasure scheduler 50 also acquires only the time stamp TS_SR of a page in which the bitmap BM SR of the scan read is "1" (target). A value indicating how much time (seconds) passes after the read disturb count reaches a predetermined number is set in the time stamp TS_SR related to the scan read.

In the determination process of Step S204, for example, when Expression 2 is satisfied for any "page k", the reliability countermeasure scheduler 50 determines that the scan read is required for the "page k".

(Current POS–time stamp $TS\_SR_k$)(predetermined time limit)     (Expression 2)

Here, "(current POS–time stamp $TS\_SR_k$)" means the length (e.g., in seconds) of the time elapsed after the latest scan read executed for the "page k" (the k-th page) is completed. The "predetermined time limit" is a threshold time for which the countermeasures are required to be executed, which is determined for each reliability countermeasure. Here, the "predetermined time limit" means a grace period which is allowable after the read disturb count reaches the predetermined number.

Regarding the page (that is, the page k) determined to require the scan read to be executed as a result of the determination process in Step S204 (YES in Step S204), in Step S205, the reliability countermeasure scheduler 50 instructs the firmware module 60 to execute the scan read for the page k. The execution command of the scan read may be transmitted not only to the corresponding page but also to a page of a word line adjacent to a word line of the corresponding page.

Following the process in Step S205, or simultaneously with the process in Step S205, the reliability countermeasure scheduler 50 sets the current POS in the time stamp TS_SR (for example, $TS\_SR_k$) of the page (for example, page k) on which the scan read is executed to be executed, in Step S206.

In Step S206, the reliability countermeasure scheduler 50 sets the current POS in the time stamps of other types of reliability countermeasures which can be skipped by executing the scan read, that is, the time stamps of other types of reliability countermeasures that do not need to be executed. In this manner, it is possible to determine that the countermeasure process is completed for other types of reliability countermeasures that can be skipped. Other types of reliability countermeasures that can be skipped by executing the scan read are, for example, the patrol read and the dummy read. The current POS is also set in the time stamps of the patrol read and the dummy read accordingly.

<Scheduling of Dummy Read>

Figure 18:
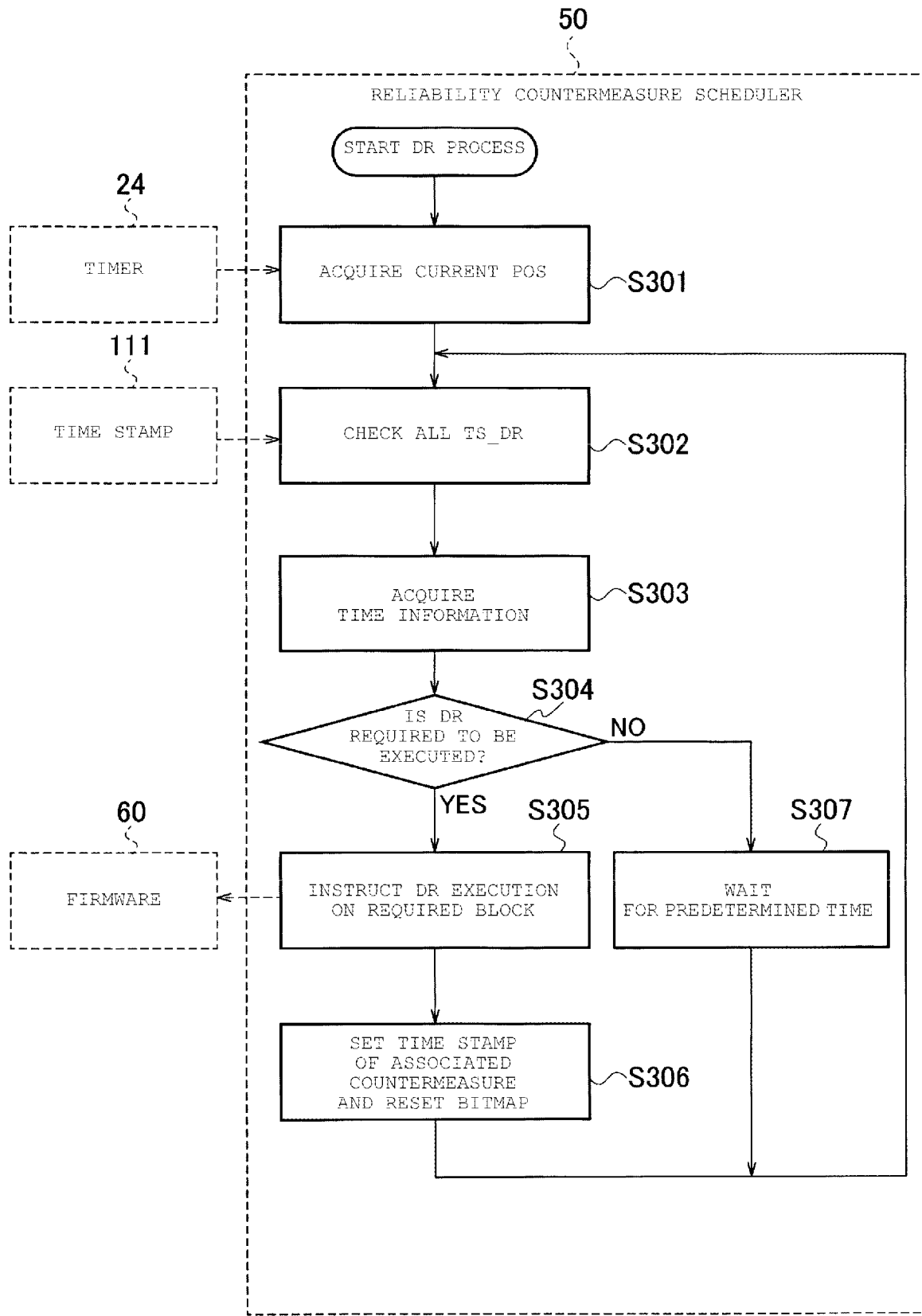
FIG. 18 is a schematic flowchart illustrating an example of a dummy read scheduling process by the reliability countermeasure scheduler in at least one embodiment.

FIG. 18 illustrates an example of a dummy read scheduling process by the reliability countermeasure scheduler 50 in at least one embodiment. The description of processes similar to those in the scheduling process illustrated in FIG. 15 will be simplified or omitted.

In Step S301, the reliability countermeasure scheduler 50 acquires the current POS from the timer 24.

In Step S302, the reliability countermeasure scheduler 50 acquires time stamps $TS\_DR_1$, $TS\_DR_2$, ..., $TS\_DR_{(n-1)}$, $TS\_DR_n$ related to the dummy read from the time stamp table 111. In this case, the reliability countermeasure scheduler 50 also acquires only the time stamp TS_DR of a block in which the bitmap BM_DR of the dummy read is "1" (target).

In the determination process of Step S304, for example, when Expression 3 is satisfied for any "block k", the reliability countermeasure scheduler 50 determines that the dummy read is required for the "block k".

(Current POS–time stamp $TS\_DR_k$)(predetermined time limit)     (Expression 3)

Here, "(current POS–time stamp $TS\_DR_k$)" means the length (e.g., in seconds) of the time elapsed after the latest dummy read executed for the "block k" (the k-th block) is completed. The "predetermined time limit" is a threshold time for which the countermeasures are required to be executed, which is determined for each reliability countermeasure.

Regarding the block (that is, the block k) determined to require the dummy read to be executed as a result of the determination process in Step S304 (YES in Step S304), in Step S305, the reliability countermeasure scheduler 50 instructs the firmware module 60 to execute the dummy read for any page included in the block k.

Following the process in Step S305, or simultaneously with the process in Step S305, the reliability countermeasure scheduler 50 sets the current POS in the time stamp TS_DR (for example, $TS\_DR_k$) of the block (for example, block k) on which the dummy read is to be executed, in Step S306.

In Step S306, the reliability countermeasure scheduler 50 sets the current POS in the time stamps of other types of reliability countermeasures which can be skipped by executing the dummy read, that is, the time stamps of other types of reliability countermeasures that do not need to be executed. In this manner, it is possible to determine that the countermeasure process is completed for other types of reliability countermeasures that can be skipped.

Example of Setting Time Stamp and Bitmap

FIG. 19 illustrates another example of setting the time stamp in at least one embodiment. As illustrated in FIG. 19, when any of the host read, the internal read, the patrol read, or the scan read is executed, the current POS may be set in each of the time stamp TS_PR of the patrol read, the time stamp TS_SR of the scan read, and the time stamp TS_DR of the dummy read. The reason is that a read operation (sense operation) is performed to the memory cell array 11A by executing any of the host read, the internal read, the patrol read, and the scan read, so that the effect of executing the dummy read can be obtained.

When the dummy read is executed, the current POS may be set only in the time stamp TS_DR of the dummy read. The reason is that, in the execution of the dummy read, a read operation (sense operation) is performed to the memory cell array 11A, but an output of the read data (data out operation) to the memory controller 20 is not performed, so that it is not possible to obtain the effect of executing the patrol read or the scan read.

FIG. 20 illustrates an example of setting the bitmap in at least one embodiment. As illustrated in FIG. 20, when a write operation (host write) is performed in accordance with an instruction from the host device 2 or when internal write is performed, the bitmaps of the patrol read and the dummy read are set, and the bitmap of the scan read is reset. When an erase operation is performed, all bitmaps of the patrol read, the scan read, and the dummy read are reset. When the read disturb count exceeds the threshold value, the bitmap of the scan read is set, and the other bitmaps are maintained as they are. When a block becomes a defective block, all bitmaps of the patrol read, the scan read, and the dummy read are reset. When the read operation equivalent to the reliability countermeasures is performed, the bitmap of the scan read is reset, and the other bitmaps are maintained as they are.

As described above, according to the memory system according to at least one embodiment, it is possible to provide the memory system and the control method thereof in which it is possible to optimize the schedule of reliability countermeasures for the nonvolatile semiconductor memory, to prevent the deterioration or quality variation of the nonvolatile semiconductor memory, and to further improve the performance and the reliability. That is, it is possible to improve the performance by skipping unnecessary reliability countermeasures, and it is possible to improve the reliability of the nonvolatile semiconductor memory by reducing the number of times of read operations to the nonvolatile semiconductor memory.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a nonvolatile semiconductor memory; and
a memory controller configured to:
schedule plural types of reliability countermeasure processes to be executed for the nonvolatile semiconductor memory, the plural types of reliability countermeasure processes including at least a first reliability countermeasure process;
skip the first reliability countermeasure process to be executed when the first reliability countermeasure process is not necessary to be executed by executing an access process other than the first reliability countermeasure process to the nonvolatile semiconductor memory;
manage a time stamp table containing the latest execution time of each of the plural types of reliability countermeasure processes;
determine whether or not to execute one of the plural types of reliability countermeasure processes based on the execution time recorded in the time stamp table;
compare a current time with the latest execution time of the one of the plural types of reliability countermeasure processes scheduled to be executed; and
execute the one of the plural types of reliability countermeasure processes scheduled to be executed, when a difference between the current time and the latest execution time is equal to or greater than a predetermined time limit.

2. The memory system according to claim 1, wherein the predetermined time limit is defined for each type of the reliability countermeasure.

3. The memory system according to claim 1, wherein the memory controller is further configured to:
in a case where an effect of the first reliability countermeasure process is achieved by executing the access process, update the latest execution time of the first reliability countermeasure process to a time of completion of the execution of the access process, and
skip the first reliability countermeasure process when a difference between the current time and the updated latest execution time of the first reliability countermeasure process is smaller than the predetermined time limit.

4. The memory system according to claim 3, wherein the memory controller is further configured to communicate with a host,
the nonvolatile semiconductor memory includes a memory cell array,
the plural types of reliability countermeasure processes further include a host read operation and a dummy read operation, the host read operation being an operation in which data is read from the memory cell array and output to the host via the memory controller, the dummy read operation being an operation in which data is read from the memory cell array but not output to the memory controller, and
the memory controller is configured to:
in response to the host read operation being executed, update the latest execution time of the dummy read operation to a time of completion of the host read operation, and
in response to the dummy read operation being executed, keep the latest execution time of the host read operation as it is.

5. The memory system according to claim 3, wherein the nonvolatile semiconductor memory includes a memory cell array, the plural types of reliability countermeasure processes further include a patrol read operation and a dummy read operation, the patrol read operation being an operation in which data is read from the memory cell array and an error correction process is performed on the read data, the dummy read operation being an operation in which data is read from the memory cell array but the error correction process is not performed on the read data, and the memory controller is configured to:

in response to the patrol read operation being executed, update the latest execution time of the dummy read operation to a time of completion of the patrol read operation, and in response to the dummy read operation being executed, keep the latest execution time of the patrol read operation as it is.

6. The memory system according to claim 3, wherein the memory controller is configured to:

manage a bitmap table containing a bit value for each type of the reliability countermeasure process, the bit value indicating whether or not each of the plural types of reliability countermeasure processes is required to be executed; and determine whether or not to execute one of the plural types of reliability countermeasure processes based on the bit value recorded in the bitmap table.

7. The memory system according to claim 6, wherein the nonvolatile semiconductor memory includes a plurality of blocks, each of the plurality of blocks including a plurality of pages and being a unit of an erase operation, and the memory controller is configured to in response to the erase operation being executed to a first block, reset the bit value for each type of the reliability countermeasure process for each of the plurality of pages included in the first block.

8. The memory system according to claim 6, wherein the nonvolatile semiconductor memory includes a plurality of blocks, each of the plurality of blocks including a plurality of pages, and the memory controller is configured to in response to a first block becoming a defective block, reset the bit value for each type of the reliability countermeasure process for each of the plurality of pages included in the first block.

9. A method of controlling a nonvolatile semiconductor memory, the method comprising:

scheduling plural types of reliability countermeasure processes to be executed for the nonvolatile semiconductor memory, the plural types of reliability countermeasure processes including at least a first reliability countermeasure process;

skipping the first reliability countermeasure process to be executed when the first reliability countermeasure process is not necessary to be executed by executing an access process other than the first reliability countermeasure process to the nonvolatile semiconductor memory;

managing a time stamp table containing the latest execution time of each of the plural types of reliability countermeasure processes;

determining whether or not to execute one of the plural types of reliability countermeasure processes based on the execution time recorded in the time stamp table;

comparing a current time with the latest execution time of the one of the plural types of reliability countermeasure processes scheduled to be executed; and executing the one of the plural types of reliability countermeasure processes scheduled to be executed, when a difference between the current time and the latest execution time is equal to or greater than a predetermined time limit.

10. The method according to claim 9, wherein the predetermined time limit is defined for each type of the reliability countermeasure.

11. The method according to claim 9, further comprising:

in a case where an effect of the first reliability countermeasure process is achieved by executing the access process, updating the latest execution time of the first reliability countermeasure process to a time of completion of the execution of the access process, and skipping the first reliability countermeasure process when a difference between the current time and the updated latest execution time of the first reliability countermeasure process is smaller than the predetermined time limit.

12. The method according to claim 11, wherein the nonvolatile semiconductor memory includes a memory cell array, the plural types of reliability countermeasure processes further include a host read operation and a dummy read operation, the host read operation being an operation in which data is read from the memory cell array and output to a host, the dummy read operation being an operation in which data is read from the memory cell array but not output to the host, and wherein the method further comprises:

in response to the host read operation being executed, updating the latest execution time of the dummy read operation to a time of completion of the host read operation, and in response to the dummy read operation being executed, keeping the latest execution time of the host read operation as it is.

13. The method according to claim 11, wherein the nonvolatile semiconductor memory includes a memory cell array, the plural types of reliability countermeasure processes further include a patrol read operation and a dummy read operation, the patrol read operation being an operation in which data is read from the memory cell array and an error correction process is performed on the read data, the dummy read operation being an operation in which data is read from the memory cell array but the error correction process is not performed on the read data, and the method further comprises:

in response to the patrol read operation being executed, updating the latest execution time of the dummy read operation to a time of completion of the patrol read operation, and in response to the dummy read operation being executed, keeping the latest execution time of the patrol read operation as it is.

14. The method according to claim 11, further comprising:

managing a bitmap table containing a bit value for each type of the reliability countermeasure process, the bit value indicating whether or not each of the plural types of reliability countermeasure processes is required to be executed; and determining whether or not to execute one of the plural types of reliability countermeasure processes based on the bit value recorded in the bitmap table.

15. The method according to claim 14, wherein the nonvolatile semiconductor memory includes a plurality of blocks, each of the plurality of blocks including a plurality of pages and being a unit of an erase operation, and the method further comprises
in response to the erase operation being executed to a first block, resetting the bit value for each type of the reliability countermeasure process for each of the plurality of pages included in the first block.

16. The method according to claim 14, wherein the nonvolatile semiconductor memory includes a plurality of blocks, each of the plurality of blocks including a plurality of pages, and the method further comprises
in response to a first block becoming a defective block, resetting the bit value for each type of the reliability countermeasure process for each of the plurality of pages included in the first block.

* * * * *